(12) United States Patent
Frentzel, Jr. et al.

(10) Patent No.: US 8,635,953 B2
(45) Date of Patent: Jan. 28, 2014

(54) METHOD AND APPARATUS FOR TENSIONING A PRINTING FORM

(71) Applicant: E I Du Pont De Nemours and Company, Wilmington, DE (US)

(72) Inventors: Theodore William Frentzel, Jr., Newark, DE (US); Carl Bernard Arnold, Newark, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/765,886

(22) Filed: Feb. 13, 2013

(65) Prior Publication Data

US 2013/0156483 A1   Jun. 20, 2013

Related U.S. Application Data

(62) Division of application No. 12/887,648, filed on Sep. 22, 2010, now Pat. No. 8,397,636.

(51) Int. Cl.
*B41F 21/00* (2006.01)

(52) U.S. Cl.
USPC ............. 101/415.1; 101/382.1; 101/383; 101/408; 101/409; 101/477; 271/275; 271/277

(58) Field of Classification Search
USPC .......... 101/382.1, 383, 415.1, 408, 409, 477; 271/275, 277
See application file for complete search history.

(56) References Cited

U.S. PATENT DOCUMENTS

| | | | |
|---|---|---|---|
| 3,858,513 A | 1/1975 | Murata | |
| 3,865,362 A | 2/1975 | Luffy et al. | |
| 3,976,261 A | * 8/1976 | Lang | 242/128 |
| 4,183,652 A | 1/1980 | Yanagawa | |
| 4,323,637 A | 4/1982 | Chen et al. | |
| 4,427,759 A | 1/1984 | Gruetzmacher et al. | |
| 4,502,388 A | 3/1985 | Ishii | |
| 4,840,121 A | 6/1989 | Szczesniak | |

(Continued)

FOREIGN PATENT DOCUMENTS

| | | |
|---|---|---|
| EP | 0 469 735 A2 | 2/1992 |
| EP | 0 653 301 A1 | 5/1995 |

(Continued)

OTHER PUBLICATIONS

Extended European Search Reports for IM1376 and IM13183.

(Continued)

*Primary Examiner* — Ren Yan

(57) ABSTRACT

A method and apparatus of securing and tensioning a printing form in an apparatus having a rotatable drum includes securing a first portion of the printing form to a first means for receiving that is coupled to a surface of the drum, and securing a second portion of the printing form to a second means for receiving that is disposed on a rotatable member that extends over a portion of the drum. The rotatable member is rotated so that the circumferential distance between the first receiving means and the second receiving means is about the same as a length of the printing form. A rotary torque means is coupled to the rotatable member to apply a substantially constant torque on the member and tension the printing form about the surface of the drum. The rotary torque means adjusts torque on the member which adjusts tension on the printing form.

8 Claims, 16 Drawing Sheets

(56) References Cited

U.S. PATENT DOCUMENTS

| | | |
|---|---|---|
| 5,052,120 A | 10/1991 | Lubberts |
| 5,279,697 A | 1/1994 | Peterson et al. |
| 5,315,931 A * | 5/1994 | Doersam .................. 101/415.1 |
| 5,322,014 A * | 6/1994 | Keller ...................... 101/415.1 |
| 5,335,046 A | 8/1994 | Bosy |
| 5,782,156 A * | 7/1998 | Collins ........................... 83/331 |
| 6,321,651 B1 | 11/2001 | Tice et al. |
| 6,412,413 B1 | 7/2002 | Tice et al. |
| 6,539,859 B2 * | 4/2003 | Williams ...................... 101/175 |
| 6,776,096 B2 * | 8/2004 | Naniwa et al. ............... 101/477 |
| 6,797,454 B1 | 9/2004 | Johnson et al. |
| 7,100,502 B2 * | 9/2006 | Heller et al. ............... 101/415.1 |
| 2001/0023648 A1 * | 9/2001 | Naniwa et al. ............... 101/477 |
| 2002/0014174 A1 | 2/2002 | Rombult et al. |

FOREIGN PATENT DOCUMENTS

| | | |
|---|---|---|
| EP | 2 124 105 A2 | 11/2009 |
| GB | 1 432 390 | 4/1976 |
| GB | 2 274 623 | 3/1994 |
| WO | 94/16895 | 8/1994 |

OTHER PUBLICATIONS

U.S. Appl. No. 12/884,678, filed Sep. 17, 2010, Odel.

* cited by examiner

METHOD AND APPARATUS FOR TENSIONING A PRINTING FORM

BACKGROUND OF THE INVENTION

1. Field of the Disclosure

The present invention pertains to devices and methods for securing printing forms on a mountable surface, such as a cylindrical surface, and maintaining proper tension on the printing forms.

2. Description of Related Art

In a process for preparing from a photosensitive element a relief printing form, the printing form is often mounted around the circumference of a rotatable drum and heated to soften unpolymerized portions of the element for removal and create a relief surface of the printing form. During thermal processing, the drum is rotated and the heated printing form is placed in contact with a development medium, such as an absorbent surface, to remove the unpolymerized portions. It is desirable for thermal processing systems to accommodate printing forms of different sizes, and in particular to mount printing forms having different lengths around a circumferential surface of the drum. It is also desirable for the printing form to be securely mounted to the drum since during thermal processing the printing form needs to withstand the rigors of one or more cycles of heating and separating the development medium from the printing form. Defects can be induced in the resulting relief printing form if during thermal processing the still warm printing form lift, sags, or bends from the drum surface. The printing form can lift off the drum or sag and separate from the drum surface as the medium separates from the printing form, or as the printing form rotates on the drum. Uncontrolled separation of the medium and the lifting or sagging of the printing form while the printing form is still hot bends the element and induces strains in the structure of the printing form which creates a defect, called waves, in the resulting relief element. It is also desirable to keep the printing form firmly against the drum surface, particularly if the drum surface is cooled, to prevent or minimize heating of a back side of the printing form and to keep a support on the backside below its glass transition temperature. If the support of the printing form is heated to or above its glass transition temperature during thermal processing, the support can distort and result in deformations in the final processed relief printing form. Further, the printing form can be securely mounted in contact with the drum surface by having the printing form held tautly or in tension to the drum. But the printing form should be properly tensioned during thermal processing since the printing form can change in one or more dimensions when heated. In some instances, the printing form can expand in length when it is heated and adjustments are needed to keep the printing form taut to the drum surface. As such, the system should be capable of adjusting so as to maintain the desired tension on the printing form throughout thermal processing and properly remove of the unpolymerized portions from the relief surface as it is generated. If the printing form is not properly tensioned around the drum, and there is too little tension, the form may pull away from the drum and the unpolymerized portions may not be thoroughly removed. If the tension on the printing form is too high, the printing form can permanently distort or end portions of the printing form that attach to the drum can be damaged. Additionally, if the printing form is not appreciably held in contact with the drum, the printing form can rub against other parts of the processor and damage the relatively soft printing surface.

Non-uniform strains imparted in the printing form by not sufficiently securing the printing form to the drum surface during thermal processing, result in deformations that remain after the printing form has cooled or returned to room temperature. The deformations are waves of localized distortions resulting in a non-planar topography of the printing form. Waves of distortions can form in different locations in each printing form processed. Relief printing forms having waves result in poor print performance. In multicolor printing, when one or more of the relief printing forms have waves the printed image has poor registration. Even in single color printing, waves in the relief printing form may print an image that is not an accurate reproduction of its original, so called image infidelity, by printing straight lines as curves for example. Further, the relief printing form having waves may incompletely print the image due to intermittent contact of the inked surface of the printing form to the printed substrate.

Although there have been attempts to design systems for securing printing forms around the circumference of rotatable drums and to maintain tension on the printing forms, such systems have proven to be unsatisfactory. The inventions disclosed herein related to new and improved systems for securing a printing form about the circumference of a rotatable drum and maintaining tension on the printing form while it is secured about the circumference.

One example of a printing form is a relief printing plate, and in particular a flexographic printing plate. The invention disclosed herein can be used with flexographic plates, as well as other printing forms. Flexographic printing plates are well known for use in printing on soft and relatively hard materials, such as packaging materials, e.g. cardboard, plastic films, aluminum foils, etc. Flexographic printing plates can be prepared from photosensitive printing forms containing photopolymerizable compositions, such as those described in U.S. Pat. Nos. 4,323,637 and 4,427,759. DuPont has sold flexographic plates under the tradename CYREL® and has sold equipment for preparing the flexographic plates under the tradename CYREL® FAST. Equipment for preparing the flexographic plates may have a rotatable drum about which the flexographic plate is disposed, and the inventions disclosed herein can be used to secure the flexographic plate about the circumference of such drums and to maintain tension on the flexographic plates.

For example, processors for thermal development of flexographic printing forms may have rotatable drums about which flexographic plates must be secured. One such processor is described in U.S. Pat. No. 5,279,697. As disclosed in U.S. Pat. No. 5,279,697, an automated process and apparatus can be used for handling an irradiated printing form and heating and pressing the print form to remove the unirradiated composition from the printing form. As disclosed in U.S. Pat. No. 5,279,697, the printing form is secured to a preheating drum with a clamp flush mounted transversely on an outer surface of the drum.

Another method and apparatus for thermal processing a printing form is disclosed in U.S. Pat. No. 6,797,454 B1. The apparatus disclosed in the publication includes a drum having a metallic surface that is coated with a thin tackification coating that temporarily adheres the photosensitive printing form to the drum. Although the drum includes a tacky surface to hold the plate to the drum, the degree of tack at times can be insufficient to prevent the printing form from slipping or moving from the drum surface.

Similarly, in a commercial thermal processor sold under the tradename CYREL® FAST 1000TD, an exterior surface of the drum includes a silicone rubber layer having a Shore A hardness of 50, and a tackification layer on the rubber layer.

The tackification layer is DOW 236, a silicone dispersion in solvent, available from Dow Corning, and it adheres the printing form to the drum.

This invention relates to new and improved systems and methods for securing printing forms on a base member for supporting the printing form, and in particular around the circumference of a rotatable drum. The inventions disclosed herein can generally be used in the processors described above as well as other processors and printing machines that process other printing forms. The inventions disclosed herein also include methods and systems for maintaining proper tension on the printing form after it has been secured around the circumference of a rotatable drum.

SUMMARY

This Summary is provided to introduce a selection of concepts in a simplified form that is further described below in the Detailed Description of Illustrative Embodiments. This Summary is not intended to identify key features or essential features of this invention, nor is it intended to be used to limit the scope of the invention.

The present invention provides a system and method for securing a printing form on a rotatable drum. Preferably, the system includes a rotatable drum, a first of pins that are coupled to the drum, a member that extends over a portion of the drum surface, and a second set of pins that are disposed on the member. The system and method preferably comprises positioning a first portion of the printing form over the first set of pins that are coupled to a surface of the drum. The first portion of the printing form is then stamped onto the first set of pins by moving a stamping bar from a nonstamping position to a stamping position. In the stamping position, the stamper bar secures the first portion of the printing form to the drum. Most preferably, the first portion is the leading edge of the printing form. The stamping can be done either by stamping the plate so that the pins penetrate through the printing form and make holes in the printing form during the stamping process or by stamping the pins through preformed holes in the printing form. Most preferably, the invention is used without preformed holes; however the term stamping as used herein can be with or without performed holes.

In a preferred embodiment, the stamper bar's motion from the nonstamping position to the stamping position is controlled by an electronic controller that is coupled to a sensor. The sensor senses the leading edge portion of the printing form being in proximity of the stamper bar and sends a signal to the controller indicating that the first portion of the printing form is under the stamper bar. In response, the controller sends a signal to the stamper bar to cause it to cycle from the nonstamping position to the stamping position, and thereby stamping the first portion of the printing form onto the first set of pins, and back to the nonstamping position.

After the first portion of the printing form is secured to the drum, a member having a second set of pins is rotated circumferentially about the drum surface. Most preferably, the member is moved in the direction of rotation of the drum, so that the circumferential distance between the first set of pins and the second set of pins, is about equal to the length of the printing form. Alternatively, the second set of pins is a moved a distance about the drum circumference in the direction of rotation of the drum a distance that is equal to the distance between the securement of the first and the second set of pins to the printing form.

Once the second set of pins is positioned, the member is coupled so that it rotates with the drum. The drum with the printing form is then rotated and as the drum is rotated, the printing form maintains its wrapped position about the circumference of the drum. Once the second set of pins is disposed under the stamper bar, the stamper bar is again cycled to stamp the second portion of the printing form onto the second set of pins. The stamper bar cycling can be triggered by a sensor that senses the position of the printing form or the tail pins and a controller that controls the motion of the stamper bar.

When it is desired, the printing form is removed from the first and second set of pins. The stripper bar preferably has fingers (or tooth-like projections) for insertion in between the first set of pins (and the second set of pins). The fingers extend so as to form a wedge-shape that is inserted under the printing form and between the pins. The printing form is removed by inserting the wedge-shaped fingers between the printing form and the drum and rotating the drum. The stripper bar can be located in one position, or can be moved, to clear the first set of pins as the drum rotates. Once the fingers of the stripper bar remove or lift the printing form from the first set of pins, the stripper bar that is wedged between the printing form and the drum continues to lift the printing form from the drum as the drum rotates. Once the drum and rotatable member rotate the second set of pins to the stripper bar, the fingers of the stripper bar are raised from the drum surface slightly in order to clear the leading edge of the bar holding the second set of pins, and the printing form can be removed from the second set of pins in a similar wedge manner. If desired, the stripper bar can be electrically controlled by an operator with a switch.

This invention also includes a method and system for maintaining tension on the printing form after it has been secured so that it can rotate with the drum. Preferably, the system includes a rotatable drum and a first of pins that are coupled to the drum. The first set of pins can preferably receive a first portion of the printing form, which is most preferably a leading edge of the printing form. The system preferably also has a member that extends over a portion of the drum surface and that is mounted to the drum, so that it can rotate with the drum at least under certain conditions and a second set of pins that are disposed on the member. The second set of pins can receive a second portion of the printing form, which is most preferably the trailing edge of the printing form. The printing form can be placed under tension by being secured to the first and the second set of pins. The system preferably further includes an actuator that is coupled to the member and can adjust the rotational torque on the member and thereby adjust the tension on the printing form. Most preferably the actuator is a pneumatic actuator that adjustably controls the tension by adjusting the air pressure on a torque means that is coupled to the member. The torque means may include at least one clutch and gearing that selectively couples the actuator to the member.

The method of tensioning a printing form that is circumferentially disposed about a rotatable drum preferably includes coupling a first portion of the printing form to the drum, tensioning the printing form by coupled a second portion of the printing form to a member that is disposed circumferentially about the drum a distance from the first printing form portion that is about equal to the distance between the first and second printing form portions. The method may also include coupling a rotary torque means to the member. The method may further include adjusting the tensioning on the printing form by using an actuator that is coupled to the rotary torque means, and most preferably a pneumatic actuator, to control the torque on the member, and thereby the tension on the printing form.

Additional features and advantages will be made apparent from the following detailed description of illustrative embodiments that proceeds with reference to the accompanying drawings.

BRIEF DESCRIPTION OF THE DRAWINGS

Preferred embodiments of the invention will now be described by way of example with reference to the accompanying drawings, wherein.

DETAILED DESCRIPTION OF ILLUSTRATIVE EMBODIMENTS

Figure 1:
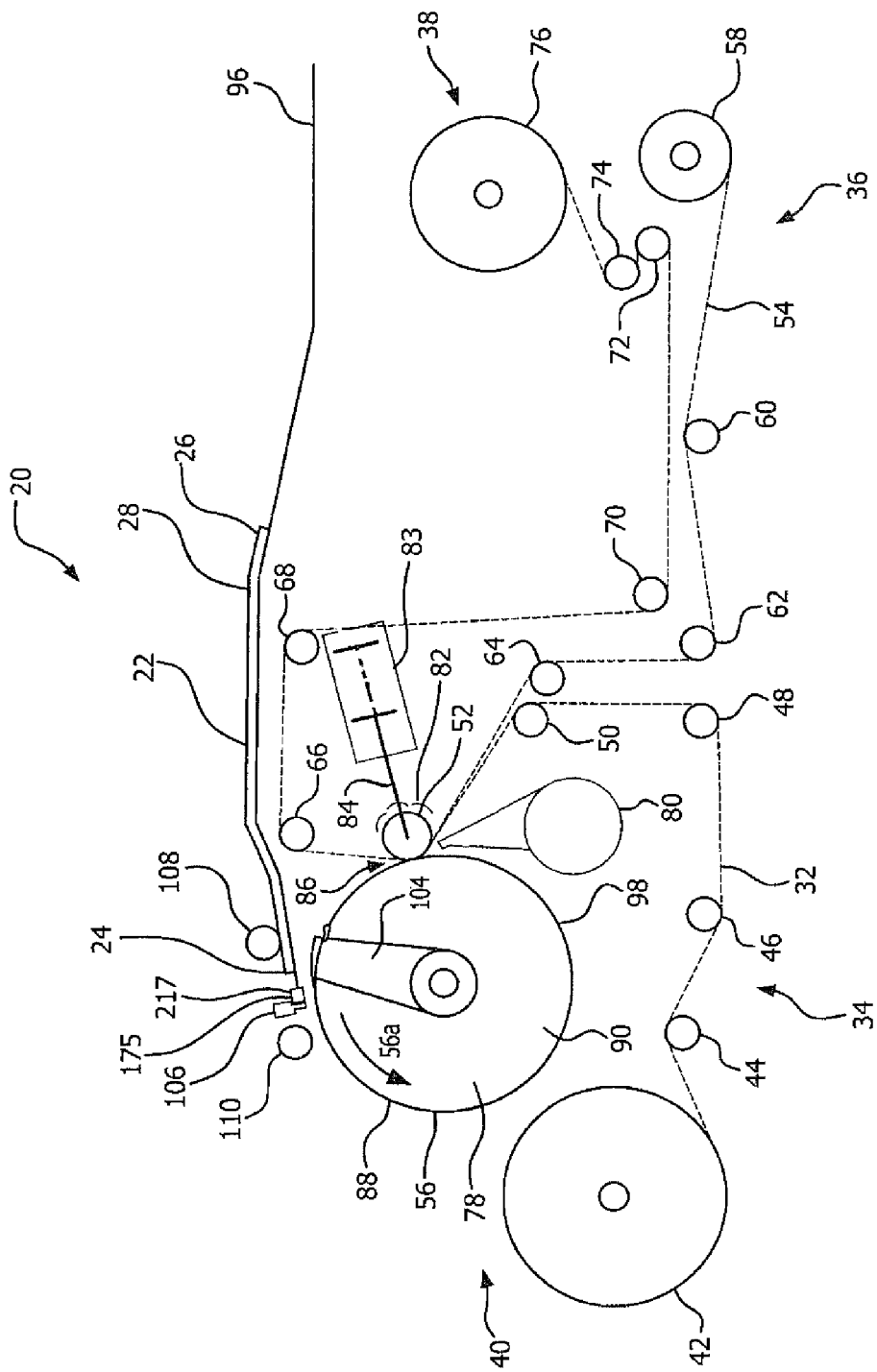
FIG. 1 is an overall schematic of one embodiment of a thermal development apparatus and process for forming a relief printing form.

A thermal development system 20 for processing a printing form is shown in FIG. 1. The printing form can be any of a variety of printing forms including, but not limited to, relief plates, such as letterpress and flexographic printing plates; plastic films; sheet materials, such as rubber; and semi-rigid and non-rigid substrates. Although flexographic plates are the preferred printing form that is used with the methods and systems of this invention, other printing forms can be used.

The inventions disclosed herein can be used with any system in which a printing form is secured about a rotatable device. The term rotatable drum is used herein to encompass any rotatable device about which a printing form is secured or mounted. For example, the inventions disclosed herein can be used with thermal processors, printing presses, other types of printing machines, and other similar devices. The inventions disclosed herein are especially useful when the printing forms vary in length. For this reason, it is further contemplated that the inventions disclosed herein have applications when a form is disposed on a flat surface. Further, this invention has applications in other areas including surface coating, surface cleaning such as grit blasting, surface engraving, and light sensitive webs. An exemplary embodiment of the type of device with which the inventions disclosed herein can be used is shown in FIG. 1. However, this thermal development system 20 is disclosed by way of example.

FIG. 1 shows a first embodiment of a thermal development system 20 in which the system is a thermal processor for processing a photosensitive printing element which is suitable for use as a relief printing form. The thermal development system 20 is used in conjunction with other machines to form a finished printing plate. Prior to processing in thermal development system 20, a printing form 22 is first exposed to actinic radiation which cures and renders insoluble the exposed portions of the printing form 22 through polymerization of the photopolymerizable layer. Printing form 22 comprises lead portion 24, tail portion 26, and exterior surface 28. After imagewise exposure, uncured portion (i.e., unexposed portion) of the printing form must be removed to form a relief surface suitable for printing. While the uncured portions may be removed using a solvent to wash away the unexposed portion, this washing process requires substantial drying time. Thermal processing avoids the use of solvents and the associated time to dry the printing form. Thermal processing as shown in FIG. 1 is therefore the preferred method.

The thermal development system 20 removes unexposed polymer from a flexographic plate or printing form 22 by heating the printing form 22 in one or more methods, thereby liquefying the unexposed portion of the printing form 22. A development medium, such as a non-woven web 32, is then put in contact with printing form 22 to absorb the molten polymer that comprises the unexposed portion of the printing form 22. The web then winds away from the printing form 22 (described in greater detail below), thereby removing the unexposed material from the printing form. Once the unexposed portion is removed from the printing form 22, the printing form 22 is removed from the thermal development system 20 and ready for use.

In the embodiment shown, the thermal development system 20 preferably includes a web subsystem 34, a foil subsystem 36, a waste subsystem 38, and a printing form subsystem 40. Each of the subsystems is described in further detail below. The novel parts of this invention relate to the new features in the printing form subsystem 40.

The web subsystem 34 continuously supplies a web 32 of development medium, preferably an absorbent non-woven web, through the thermal development system 20. It will be appreciated that web 32 may be comprised of any material, unwoven or woven, capable of transferring unexposed portions of a printing form away from the printing form. The purpose of the web is to contact printing form 22 and remove the molten unexposed portion of the printing form during thermal processing. The web subsystem 36 preferably includes a supply roll 42 and rollers 42, 44, 46, 48, and 50. The absorbent web 32 is unwound from the supply roll 42 and passes between rolls 44, 46, 48, and 50 in a serpentine path. As is described further below, the web 32 is then guided over a pressure roller 52 where it is mated with a foil 54 that is supplied from the foil subsystem 36 and is contacted with the printing form 22 which wrapped around the drum 56 of the printing form subsystem 40.

The foil subsystem 36 preferably supplies a PET foil to mate with the printing form 22. The purpose of the foil 54 is to protect portions of the thermal development system 20 from the molten unpolymerized portion of the printing form 22 and other volatiles that are released during the development process. While web 32 absorbs much of the molten portion of the printing form 22, it is possible that the molten material could, without the presence of the foil 54 penetrate the web 32, creating deposits on the pressure roller 52 and other rolls within waste subsystem 38. The foil 54 prevents the creation of these deposits and further prohibits the condensation of volatiles on parts of the thermal development system 20. Although the foil 54 can be any suitable material, the foil is most preferably a polyethylene terephthalate (PET) foil. In the preferred embodiment shown, the foil subsystem 36 includes a supply roll 48 and rollers 60, 62, and 64. The foil 54 is unwound from the supply roll 58 and passes between rolls 60, 62, and 64 in a serpentine path. The foil 54 is then guided over the pressure roller 52 where it is mated with absorbent web 32 such that the foil 54 is pressed against the web 32, which is pressed against the printing form 22.

The waste subsystem 38 is for collecting the used web 32 and foil 54. The waste subsystem 38 preferably includes rollers 66, 68, 70, 72, 74, and 76. Rollers 66, 68, 70, 72, 74, and 76 are take-up rollers that provide a serpentine path for the web and the foil after they have been pressed against each other in the printing form subsystem. Roller 76 is a waste take-up roller around which the web 32 and the foil 54 are collected.

One or more of the rolls 44, 46, 48, 50, 66, 68, 70, 72, 74 as well as take-up roll 76 may drive the web 32. One or more of the rolls 60, 62, 64, 66, 68, 70, 72, 74 as well as take-up roll 76 may drive the foil 54. One or more of the rolls 44, 46, 48, 50, 60, 62, 64, 66, 68, 70, 72, 74 or even the supply rolls 42 and 58 may include a braking mechanism to maintain tension of the web 32 and foil 54 in its transport path. The brake may be an electronic brake of the type known in the art. Further, the number of rollers and the path of the web and the foil is shown by way of example, and any number of rollers and paths can be used.

The printing form subsystem 40 preferably includes drum 56, cooling system 78, external heater 80, pressure roller 52, infrared heaters 82, arms 84, and nip 86. Drum 56 is the attachment point for printing form 22 during the thermal development process. Drum 56 is also described in greater detail in reference to printing form securing and tensioning subsystems 100, 220. Drum 56 is used to rotate the printing form 22 against the web 32 so that the unexposed molten polymer may be removed. Drum 56 has a generally cylindrical shape and comprises surface 88. Drum 56 further comprises ends 90 and 92 (shown in FIG. 10). Drum 56 is mounted for rotation on a stationary support frame (not shown). In this embodiment, the drum 56 rotates in a counterclockwise direction as indicated by arrow 56a. It will be apparent to those skilled in the art that the thermal development system 20 can be configured so that the drum 56 rotates in the clockwise direction. The drum 56 is non-flexible or substantially non-flexible such that the drum 56 does not significantly change shape during the thermal development process.

In the preferred embodiment, drum 56 further comprises cooling system 78. Cooling system 78 is preferably a water cooling system wherein cold water circulates within the drum so as to maintain the temperature of the backside or support of the printing form 22 while it is touching the drum 56. In one embodiment, the support of the printing form is maintained at a temperature less than the glass transition temperature of the support for the printing form, i.e., at less than 130 degrees F. This ensures that support does not distort and the printing form 22 retains its shape. As is disclosed in U.S. Pat. No. 6,797,454 B1, it is also possible that the drum be cooled by an alternative cooling means, such as a blower (not shown) directing a stream of air at the surface of the photosensitive printing form 22 and the drum 56.

Alternatively, the drum 56 may also be equipped with a drum heater (not shown). The drum heater (not shown) may be used to keep the photosensitive printing form 22 at a stable starting temperature independent of the surrounding environment during thermal development so that the undeveloped portion of the printing form is at a molten state and can be absorbed by web 32. The drum heater (not shown) may be an electrical heating blanket, such as a wire wound blanket. However, any means of heating the drum 56 is acceptable, as long as the power capacity of the heater is sufficient to maintain a fairly constant selected skin temperature on the exterior surface 88 of the drum 56. The means for heating the drum is capable of heating the drum 56 to a temperature capable of heating the exterior surface 28 of printing form 22. It is also contemplated that a heating fluid, such as water, may be circulated beneath the surface of the drum 56 to heat the printing form 22.

In the preferred embodiment shown, the temperature of the exterior surface 88 of the drum is about 50 to 150° F. (10 to 65.6° C.), preferably 75 to 95° F. (23.9 to 35° C.). These parameters are illustrative and the parameters can be adjusted to fit the specific application. If the normal operating environment is carefully controlled to be at a constant temperature, the heater can be turned off or omitted from the apparatus.

In one embodiment, printing form subsystem 40 further comprises external heater 80. External heater 80 is located adjacent the drum 56 and, in the embodiment illustrated, is a slot jet forced air heater with a blower directed at an exterior surface 28 of the printing form 22. The external heater 80 elevates the temperature of the surface 28 of the printing form 22 to a temperature sufficient to melt or soften the unexposed portion of the printing form 22, causing a portion of the layer to liquefy. In a liquid state, the uncured portion of the printing form 22 can be absorbed by web 32. The air heater 80 functions by blowing heated air on to the exterior surface 28 of the printing form 22. In the embodiment illustrated, the external heater 80 is pneumatically positioned to heat the printing form 22.

In an alternate embodiment (not shown), external heater 80 may comprise a plurality of tubular infrared heating bulbs mounted in end supports that provide electrical connections to the bulbs. This alternate embodiment further comprises a reflector located adjacent the side of the bulbs that acts to focus and direct the infrared radiation toward the exterior surface 28 of the photosensitive printing form 22. In another alternate embodiment (not shown), external heater 80 uses one tubular infrared heating bulb mounted in the end supports with the reflector.

Printing form subsystem 40 may include a pressure roller 52 as another means for heating the printing form 22. The pressure roller 52 maintains or further elevates the temperature of the exterior surface 28 of the printing form 22, thereby ensuring that the undeveloped portion of the printing form is in a liquid state when in contact with web 32. Pressure roller 52 can be heated by radiant heaters 82, such as infrared heater/s. The pressure roller 52 can be heated by other heating means, such as a cartridge heater. The pressure roller 52 is positioned adjacent the drum 56 which carries the printing form 22. The pressure roller 52 is also adjacent the heater 80.

Pressure roller 52 also acts as the means by which web 32 and foil 54 contact the exterior surface 28 of the printing form 22. After web 32 and foil 54 pass through web subsystem 34 and foil subsystem 36, respectively, web 32 and foil 54 join by passing around pressure roller 52 along a serpentine path. As web 32 and foil 54 pass pressure roller 52, web 32 is pressed against the exterior surface 28 of printing form 22, thereby absorbing the molten unexposed portion of the printing form 22.

Printing form subsystem 40 further comprises arms 84 which provide a means for relative motion between the drum 56 and the pressure roller 52. Arms 84 function so that the photosensitive printing form 22 and the web 32 of development medium can be brought into contact with the other. Means for providing relative movement can be accomplished, for example, by mounting the pressure roller 52 (and/or drum 56) onto arms 84 attached to a two-position pneumatic roll loading cylinder/s 83 that moves the pressure roller 52. In alternative embodiments, relative movement of the pressure roller 52 may be actuated by stepping motors or servo motors. Temperature sensors may also be mounted throughout the thermal development system 20 to monitor the temperature for the purpose of controlling the heating elements in the drum 56, pressure roller 52, and heater 80.

The nip 86, or distance between the pressure roller 52 and the drum 56, when the pressure roller 52 is in the engaged position for this embodiment, is preferably zero centimeters. It is desirable to set the distance such that a substantially uniform pressure is applied to the nip 86 of the exterior surface 28 of the form 22 during processing. Pressure is applied to force the absorbent web into intimate contact with the photosensitive printing form 22. It will be appreciated that the nip 86 can be adjusted to a different parameter to suit any particular application.

The heater 80 acting as a first heating means and the pressure roller 52 acting as a second heating means, independently or in any combination, are capable of heating the exterior surface 28 of the photosensitive printing form 22 to a temperature sufficient to cause a portion, i.e., an unexposed portion, of the composition layer to liquefy. Additional and alternate methods of heating the printing form 22 are possible and inclusion into the present system and method is within the skill of those in the art. Cooling system 78 functions to cool the backside surface, e.g., support, of the printing form 22 to ensure that the printing form retains its shape during thermal processing.

The operation of the apparatus for the process of thermally developing the photosensitive printing form 22 is described in reference to FIG. 1. The thermal development system 20 is in a home position with the drum 56 stationary and adjacent the feed tray 96. A support member 98 was previously mounted onto the drum 56. Alternatively, the drum 56 is constructed with a support member 98 that is integral to the drum 56. The support member 98 includes an exterior surface 88. The operator places the photosensitive printing form 22 on feed tray 96. An operator then engages the lead portion 24 of the printing form 22 on drum 56 (described in greater detail below). The heater 80 and/or the optional drum heater (not shown) may be used to preheat the drum 56. Cooling system 78 may also be used to cool the drum 56. The cartridge heater (not shown) for the pressure roller 52 is used to preheat the pressure roller. The drum 56 starts turning and carries the printing form 22 with it so that the photosensitive printing form 22 is adjacent the support member 98. The heater 80 may be preheated before the printing form 22 reaches the heater 80, and then switched to an operating setting to achieve the desired temperature for melting, softening or liquefying the composition layer on the printing form 22. After the lead portion 24 of the printing form 22 passes the position where the pressure roller 52 will contact the drum 56, the pneumatic roll loading cylinder/s 83 moves the arms 84 attached to the pressure roller 52 thereby carrying the absorbent web 32 and foil 54 against the printing form 22. The photosensitive printing form composition layer is most preferably heated to between 40 and 230 degree C. (104 and 392 degree F.) while in contact with the development medium. (These parameters are illustrative). The development web 32 contacts the exterior surface 28 of the printing form 22, and absorbs the liquefied portions of the polymer from the unexposed portions of the composition layer, forming a relief pattern or surface suitable for use as a flexographic printing form. By maintaining more or less intimate contact of the development medium 32 with the printing form 22 that is molten in the uncured regions, a transfer of the uncured photosensitive material from the printing form 22 to the development web 32 takes place. While still in the heated condition, the development web 32 is separated from the cured printing form 22 to reveal the relief structure.

As the trailing portion of the printing form 22 passes the pressure roller/drum contact point, i.e., nip 86, the heater 80 may cool down or turn off, the pneumatic roll loading cylinder 83 will retract the pressure roller 52, and travel of the web 32 and foil 54 will be stopped. The drum 56 may return the lead portion 24 of the printing form 22 to the home position to begin another cycle of heating and contacting. A cycle of the steps of heating the printing form 22 to liquefy the exterior surface 28 and contact the molten portions with the development medium can be repeated as many times as necessary to adequately remove the uncured material and create sufficient relief depth. However, it is desirable to minimize the number of cycles for suitable system performance, and typically the photopolymerizable printing form is thermally treated for 5 to 15 cycles. Intimate contact of the development material to the composition layer (while the uncured portions are melting or liquefying) may be maintained by the pressing the layer and the development material together.

The novel features of this invention relate to the printing form securing subsystem 100 including actuator subsystem 160, and printing form tensioning subsystem 220, and printing form removal subsystem 230, all of which can be used in the processor 20 to secure the printing form about the rotatable drum 20 and to maintain tension on the printing form during operation of the processor 20. Although the novel features of this invention are described with reference to the thermal processor 20, it will be appreciated that the inventions disclosed herein can be used with any machine that uses a printing form that must be secured and/or tensioned about a rotatable drum. The printing form securing subsystem 100 and its operation will be described first, and are followed by a description of the structure and operation of the tensioning subsystem 220.

Printing Form Securing Subsystem

In the preferred embodiment shown in FIGS. 2-7, the printing form securing subsystem 100 includes a drum 56, head pin bar 102, rotatable member 104, stamper bar 106, laydown rolls 108, 110, and actuation subsystem 160. As described above with reference to printing form subsystem 40, drum 56 is the attachment point for printing form 22 during the thermal development process. Drum 56 is also used to rotate the printing form 22 against the web 32 so that the unexposed molten polymer may be removed. Additionally, drum 56 functions to secure and create tension on the printing form 22 as further described below in relation to printing form tensioning subsystem 220. Moreover, printing form securing subsystem 100 permits the system to receive plates of different lengths because the system can be used to secure the printing form at any two circumferential points with respect to the drum.

Printing form securing subsystem 100 also includes a head pin bar 102 that is located on surface 88 of drum 56. Head pin bar 102 functions to secure one portion of printing form 22, which is preferably the leading edge portion of the printing form 22. Head pin bar 102 comprises pins 112 aligned in a generally linear manner across the surface 88 of drum 56. Head pin bar 102 may include cutouts to aid in removal of the printing form 22 as described in greater detail in relation to the printing form removal subsystem described below. Pins 112 function to pierce a first portion, preferably the lead portion 24, of the printing form 22, thereby securing the lead portion 24 to the drum 56. Alternatively, the printing form may have preformed holes and the pins 112 can be stamped through the preformed holes to secure the first portion of the printing form.

Pins 112 function to pierce the printing form 22, or to be inserted through preformed holes in the printing form 22, and secure the first portion, preferably the lead portion 24, of printing form 22 to drum 56. The material comprising the pins is not limited providing that the pin material will maintain a piercing point sufficiently sharp to pierce printing forms and/or maintain its shape with use in securing and tensioning a plurality of printing forms. In one embodiment, pins 112 may be comprised of commercially available hardened steel dowel pins. Other materials suitable for the pins include a tool steel type of material such as 4140 or 4037 and hardened to about Rockwell 54C/58C. The tool steel material meets standard ASME B18.8.2. Other suitable materials for the pins include AISI (American Iron and Steel Institute standard) 5155, or 5155H, chromium steel quenched and tempered to a minimum surface hardness of 60 HRC; and, AISI 6150, or 6150H, chromium-vanadium steel quenched and tempered to a minimum surface hardness of 60HRC. Other types of relatively hard stainless steels may be used.

The pins 112 have pointed top portions and are spaced apart across a width (i.e., axial length) of the drum 56 in a number sufficient to securely hold the first portion of the printing form 22 to the drum 56 with tension during processing. In one embodiment, pins 112 have pointed top portions and are spaced approximately 0.438 inches apart across the width of the drum 56 on 0.500 inch centers. The pins are 0.0625 inches in diameter. In order to couple the pins 112 to the drum surface 88, the drum 56 has a machined slot (not shown) that runs the width of the drum 56. The pins 112 are press fit into a series of brass bars (not shown) which are then fastened by bolting into the slot in the drum 56. One of skill in the art will appreciate that the bars holding the pins (not shown) may be comprised of a wide range of semi-soft materials including aluminum or an aluminum-bronze alloy. Those of skill in the art will appreciate that the pins 112 may be coupled to the drum 56 with any of a variety of techniques. This may include attaching the pins 112 from inside the drum 56 or welding pins 112 to the surface of the drum.

To securely handle or retain the printing form, in most embodiments the pins 112 have a height above the drum surface that sufficiently extends through the printing form thickness. In embodiments in which the printing form 22 is composed of an elastomeric layer, the pins 112 have a height such that the thickness of the printing form 22 is seated at or below a highest point of the angled tip end of the pins 112. As shown in detail in FIG. 2a, in one embodiment the pins 112 typically extend 0.250 inches above the drum surface in order to handle a printing form 22 up to 0.250 inches thick. The pins 112 extend radially from the drum centerline and typically are sharpened on one side to an included angle of about 65 degrees (i.e., the angle of the sharpened surface is 65 degrees from a plane perpendicular to an axis of the pins 112). A person of skill in the art will appreciate that pins 112 may be shaped in multiple ways. For example, pins 112 may have an angle other than 65 degrees and may contain unsharpened top portions. Additionally, in some applications, it may be desirable to have the pins 112 at a slight angle to the tangent line to the drum surface 88 to aid the securing subsystem 100 in keeping the printing form 22 on the drum 56 during processing.

The securing system 100 of this invention is novel and the first set of pins and the second set of pins comprise respectively a novel means for receiving a first and a second portion of the printing form. It will be appreciated that other inventions are disclosed herein such as novel tensioning and activation systems. The novel tensioning and activation subsystems can be used with the securing system as described above with the first and second set of pins constituting a first and second means for receiving respectively a first and second portion of the printing form. However, the novel tensioning and activation subsystems can be employed with other first and second means for receiving the printing form. For example, the novel tensioning and activation subsystems may be used with first and second means for receiving that comprise clamps or other structure that secures the lead portion 24 and the tail portion 26 relative to the drum 56. It should be noted, however, that clamps operate substantially differently than the pins described above, as pins penetrate the material and rely on friction between the pins and the printing form as well as the tension on the printing form to secure the printing form, while clamps rely on a frictional compressive clamping force to secure the printing form. It is well within the skill of one in the art to contemplate suitable clamps and other structures as alternative first and second means for receiving lead portion 24 and tail portion 26 of the printing form, provided that such alternative can accommodate the printing form tensioning subsystem 220. It is also contemplated that a set of pins and a clamping device or other structure could be used in combination for either of the first or the second means for receiving a portion of the printing form, provided that such a combination can accommodate the printing form tensioning subsystem 220, i.e., can function with a rotary torque means to maintain tension on the printing form.

Printing form securing subsystem 100 further comprises rotatable member 104. Rotatable member 104 functions to assist in positioning lead portion 24 of printing form 22 to head pin bar 102. Rotatable member 104 also functions to secure a tail portion 14 of printing form 22 and to maintain tension on the printing form 22.

Rotatable member 104 comprises body 114, end 116, and arms 118. Body 114 has a generally rectangular shape with six sides: front 120, back 122, top 124, bottom 126, left side 128, and right side 130. Right side 130 comprises flat edge 132. Flat edge 132 functions to assist in securing lead portion 24 of printing form 22 by aiding in the alignment of the lead portion 24 of the printing form 22.

End 116 of rotatable member 104 further comprises tail pin bar 134. Tail pin bar 134 functions to secure a second portion, which is most preferably the tail portion 26, of printing form 22 with tail pin bar 134. End 116 has generally 5 sides: top 136, bottom 138, front 140, back 142, and side 144. End 116 has a generally triangular cross-section. End 116 connects to body 114 along side 144 of end 116 and left side 128 of body 114.

Tail pin bar 134 is located on end 116. Tail pin bar 134 comprises pins 146 that are aligned in a generally linear manner in such a way that pins 132 are generally parallel to pins 112 of head pin bar 102. Pins 146 are secured in end 116 and the top portions of pins 146 protrude out from the top 136 of end 116. Pins 146 function to pierce the printing form 22 and secure tail portion 26 of printing form 22 to rotatable member 104. Alternatively, pins 146 can be inserted or stamped through preformed holes in the printing form 22. Pins 146 may be comprised of the same material as the pins 112 or, may be made of any other suitable material as described in relation to pins 112.

The pins 146 have pointed top portions and are spaced apart across a width (i.e., axial length) of the body 114 in a number sufficient to securely hold the second portion of the printing form 22 to the rotatable member 104 in tension during processing. In one embodiment, pins 146 have a pointed top portion and are spaced approximately 0.438 inches apart across the width of the rotatable member 104 on 0.500 inch centers. Instead of being actually embedded into the rotatable member 104, the rotatable member 104 has a machined slot (not shown) that runs the width of the drum 56. The pins 146 are press fit into a series of brass bars (not shown) which comprise tail pin bar 134. The brass bars are then fastened by bolting into the slot in the rotatable member 104. As described above, one of skill in the art will appreciate that the bars holding the pins (not shown) may be comprised of a wide range of soft materials including aluminum and aluminum-bronze alloys.

To securely handle or retain the printing form, in most embodiments the pins 146 have a height above the top 136 of the rotatable member 104 that sufficiently extends through the printing form thickness. In embodiments in which the printing form 22 is composed of an elastomeric layer, the pins 146 have a height such that the thickness of the printing form 22 is seated at or below the tip end of the pins 146. As shown in detail in FIG. 2a, the pins 146 typically extend above the top 136 of end 116 of rotatable member 104 at a height sufficient to retain or handle a printing form 22. In one embodiment, the pins 146 extend 0.250 inches above the top 136 of end 116 of rotatable member 104 in order to handle a printing form 22 up to 0.250 inches thick. In one embodiment, the pins 146 extend radially from the rotatable member 104 (based on the relative normal direction of the top surface 136 of the rotatable member 102) and typically are sharpened on one side to an included angle of about 65 degrees (i.e., the angle of the sharpened surface is 65 degrees from a plane perpendicular to the axis of the pins 146). As described above, a person of skill in the art will appreciate that pins 146 may be attached to the drum 56 and positioned and shaped in multiple ways. This may include attaching the pins 146 from inside the rotatable member 104 or welding pins 146 to the top 136 of end 116 of rotatable member 104. Similarly, pins 146 may be positioned at angles other than 65 degrees and may contain unsharpened top portions.

Rotatable member 104 further comprises arms 118. Arms 118 function to rotate rotatable member 104 independently and separate from drum 56. The rotation of rotatable member 104 with arms 118 further assists in securing the tail portion 26 of printing form 22 to rotatable member 104. Arms 118 comprise an inner portion 148 and outer portion 150. Arms 118 sit adjacent to ends 90 and 92 of drum 56. Outer portion 150 connects to body 114 of the rotatable member 104. Inner portion 148 connects the rotatable member 104 to rotatable member axis 152. Rotatable member axis 152 is congruent to drum axis 154. Drum axis 154 is defined as the axis about which drum 56 rotates. Additional features of the rotatable member 104 are described below with reference to printing form tensioning subsystem 220.

Printing form securing subsystem 100 further comprises stamper bar 106. Stamper bar 106 functions to press printing form 22 onto head pin bar 102 and tail pin bar 134. Stamper bar 106 further includes plate engaging portion 156. Plate engaging portion 156 comprises stamper bottom 158. In one embodiment, stamper bottom 158 comprises a "tooth-like" surface (not shown) having apertures that corresponds to the shape and spacing of pins 112, 146. Other embodiments may include cut-outs in the shape of pins 112, 146. As stamper bar 106 engages the printing form 22, stamper bar 106 presses printing form 22 on to pins 112, 146. The engagement of stamper bar 106 with printing form 22 causes pins 112, 146 to puncture printing form 22, thereby securing the a portion of the printing form on the pins 112, 146. The stamper bar 106 may be controlled manually, but it is preferably controlled by automation. For example, a sensor may sense when the leading edge 24 of the printing form 22 is under the stamper bar 106, and send a signal to a controller, that causes the stamper bar 106 to cycle and move from a nonstamping position to a stamping position and back to the nonstamping position. In the stamping position, the stamper bar 106 pushes the printing form 22 through either the first or the second set of pins.

Printing form securing subsystem 100 further comprises laydown rolls 108, 110. Laydown rolls 108, 110 engage printing form 22 during the process of securing the printing form 22 to ensure that printing form 22 is aligned flush with the surface 88 of the drum 56. In the embodiment shown, laydown rolls 108, 110 are generally cylindrical in shape. Laydown rolls 108, 110 are affixed within printing form securing subsystem 100 in such a way that rolls 108, 110 may be in an engaged position wherein rolls 108, 110 touch the printing form 22 and a disengaged position wherein the rolls 108, 110 do not contact the printing form 22 on drum 56. While the preferred embodiment shows two laydown rolls 108, 110, it will be appreciated that only one laydown roll 110 is required for securing, tensioning, and removing printing form 22. It will further be appreciated that more than two laydown rolls may be used to as to further control positioning of printing form 22.

Figure 8:
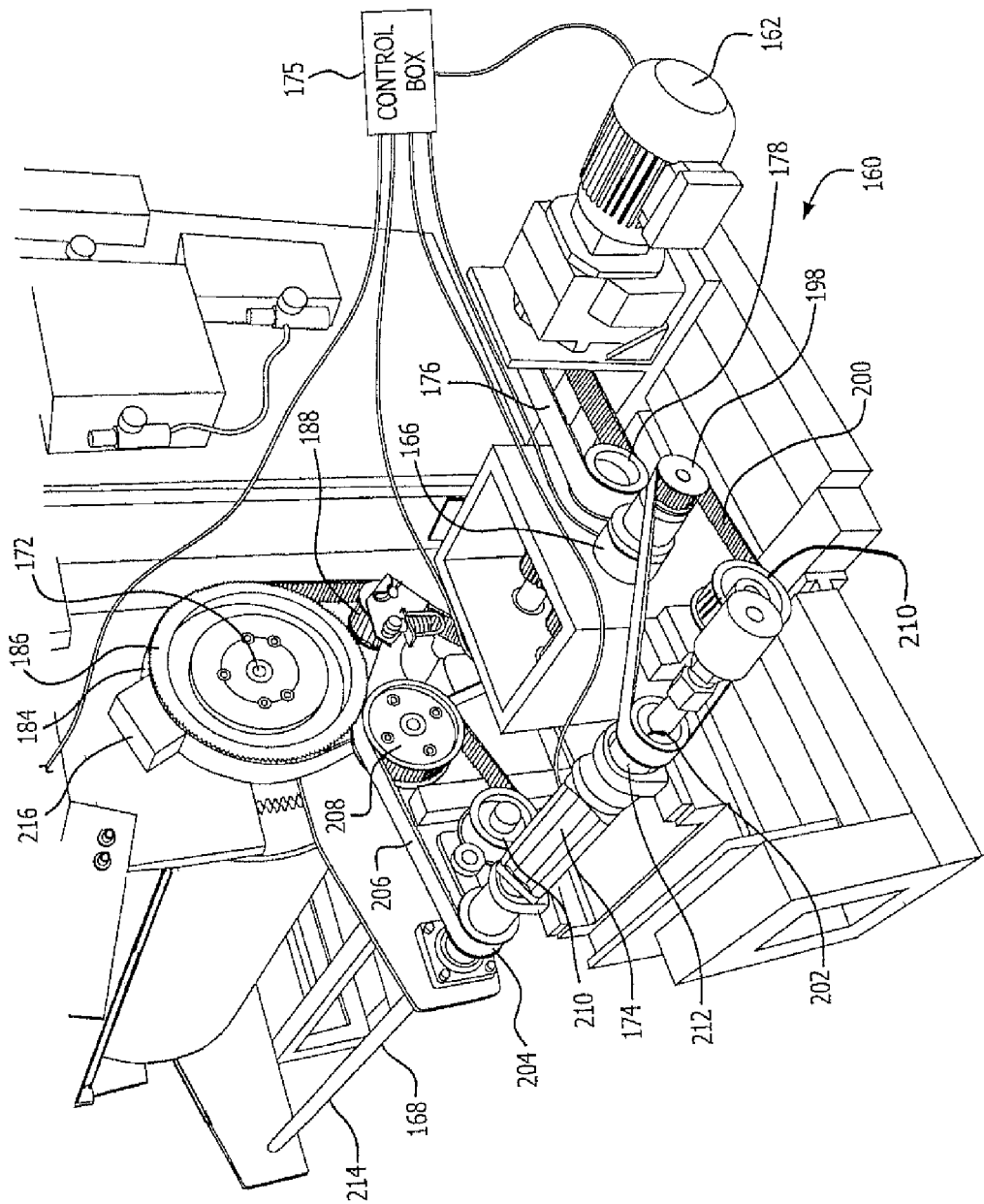
FIG. 8 is a perspective view of one embodiment of a printing form actuation system.

Printing form securing subsystem 100 further comprises drum brake 216. Drum brake 216 is shown in FIG. 8. Drum brake 216 is used during the securing process to restrict the motion of drum 56. Drum brake 216 is preferably a shoe brake. It will be appreciated that drum brake 216 may alternatively be a friction type disc brake, a toothed non-slip type brake, or a cylinder activated alignment pin with matching alignment hole.

Figure 9:
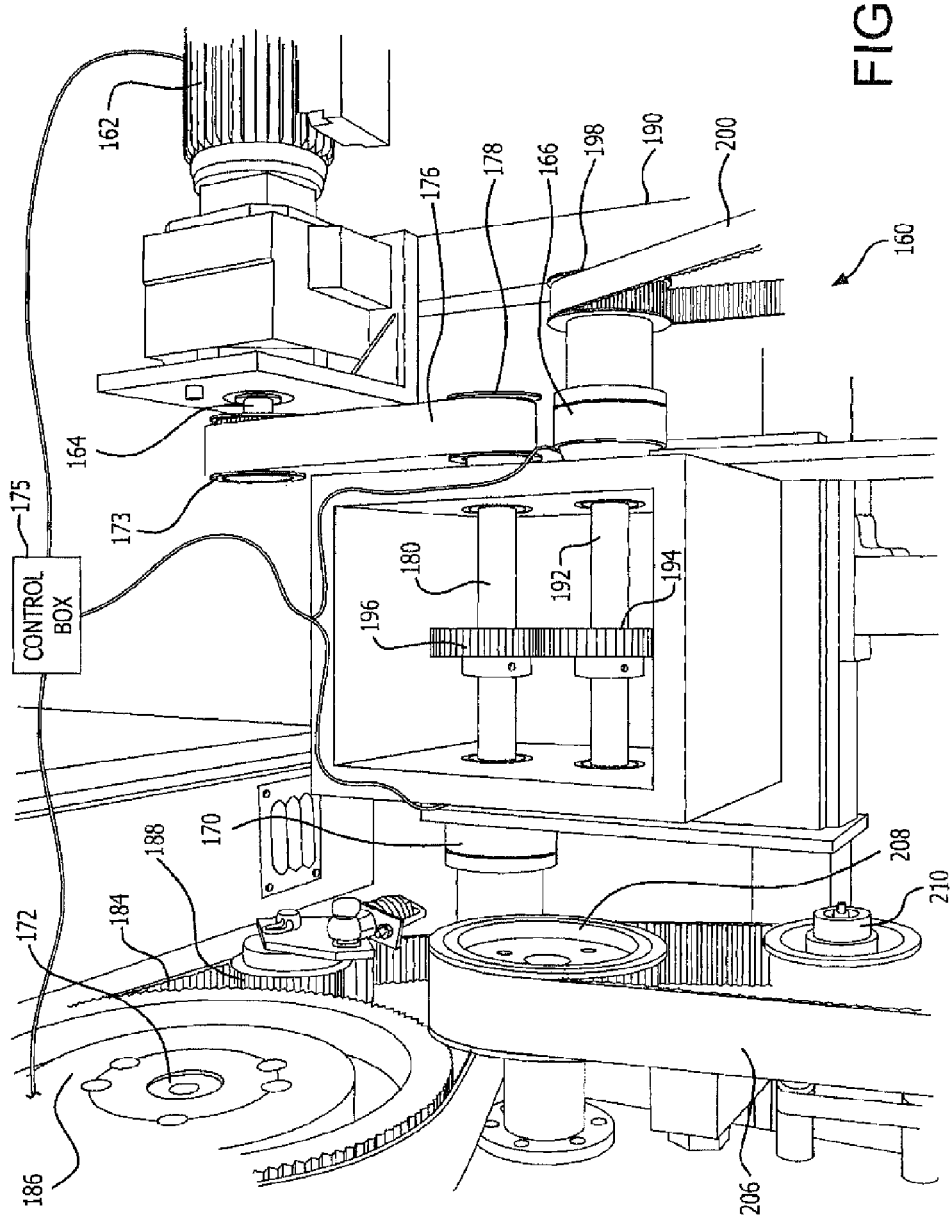
FIG. 9 is a perspective view of a the printing form actuation system shown in FIG. 8.

Printing form securing subsystem 100 further comprises actuation subsystem 160 as best shown in FIGS. 8 and 9. Actuation subsystem 160 actuates the other components of printing form securing subsystem 100 during the process of securing the printing form. Actuation subsystem 160 also actuates the tensioning subsystem 220 and is described in further detail below in relation to the printing form tensioning subsystem 220.

Actuation Subsystem

In one embodiment, actuation subsystem 160 comprises motor 162, motor shaft 164, arm clutch 166, arm shaft 168, drum clutch 170, drum shaft 172, torque conditioner or rotary torque means 174, brake 216, control system 175 and gears and belts as described below. In one embodiment, motor 162 drives the rotation of rotatable member 104 and drum 56. The actuation subsystem 160 can selectively rotate the drum 56 and the rotatable member 104 so that they can each be rotated separately or rotated at different speeds to create a differential torque and place tension on the printing form 22 that is securely mounted about the circumferential surface of the drum 56. Motor 162 may be any type of suitable motor including an Inverter Grade, A-C, 3-phase motor. Alternatively, a D-C Permanent Magnet motor, a stepper motor, or a servo motor may be used. Except as expressly indicated, the embodiment described herein is illustrative and other ways of actuating the drum 56 and the rotatable member 104 so that they can rotate independent of each other can be used.

Motor shaft 164 provides a rotary output of the motor 162 that is used to drive the rotation of the drum and the rotary member. Motor shaft 164 connects to arm clutch 166 and drum clutch 170. When in the engaged position, arm clutch 166 and drum clutch 170 allow motor shaft 164 to transfer actuation from motor 162 to the rotatable member 104 and drum 56, respectively. More specifically, in the engaged position, arm clutch 166 connects motor shaft 164 to arm shaft 168 and drum clutch 170 connects motor shaft 164 to drum shaft 172. Drum shaft 172 is attached to drum 56 and actuates the rotation of drum 56 through its own rotation.

In the embodiment shown in FIGS. 8, 9 and 10, motor shaft 164 may be coupled to the drum drive shaft 172 as follows. The motor shaft 164 can have a motor drive gear 173 around which a belt 176 is disposed. The belt 176 is also connected to a gear 178, which is disposed on drive shaft 180. Drum clutch 170 is disposed at the end of the drive shaft 180. Coupled to the drum clutch 170 is a sprocket 182. A belt 184 is disposed about sprocket 182. Belt 184 is also disposed about drum drive gear 186. The belt 184 may also be disposed about planet gear 188 which provides belt tension.

In order for motor 162 to drive drum 56, the motor rotates motor shaft 164. The rotation of motor shaft 164 causes the belt 176 to rotate and to rotate gear 178. Rotation of gear 178 causes the shaft 180 to rotate. If the clutch 170 is engaged, the rotation of shaft 180 causes the sprocket 186 to rotate which drives belt 184. Movement of belt 184 rotates drive gear 186, which causes the drum shaft 172 to rotate and rotation of the drum 56. This embodiment is illustrative and those skilled in the art can configure the mechanical connections between the motor and the arms and the drum and still be within the scope of this invention.

The actuator subsystem 160 further includes shaft 192 having gear 194. Also included is gear 196 disposed on shaft 180. The actuator subsystem 160 further includes arm clutch 166 that is coupled to shaft 192. Attached to arm clutch 166 is gear 198. Belt 200 is engaged with gear 198 and gear 202 as best shown in FIG. 8. A torque conditioner 174 is rotationally attached to gear 202 and mounted on shaft 168. Also mounted on shaft 168 is a gear 204, which is coupled by a belt 206 to rotatable member drive gear 208, which is coupled to the member shaft 168 and the rotatable member 104. A planet gear 210 may also be used with each of the belts 200, 206, 207 to provide the tension on the belts 200, 206, 207.

In order to rotate the rotational member 104, the motor 162 rotates the gear 173, which drives the belt 176 to rotate. Rotation of the belt 176 rotates gear 178, which rotates shaft 180. Rotation of shaft 180 causes rotation of gear 196, which causes rotation of gear 194. Rotation of gear 194 causes rotation of shaft 192. If arm clutch 166 is engaged, the rotation of shaft 192 causes rotation of gear 198, which rotates belt 200. Movement of belt 200 causes rotation of gear 202 and rotation of the torque conditioner 174. The torque conditioner 174 can, as described further below, change the rotation force provided by the gear 198 to create a different rotational force between the rotatable member 104 and the drum 56. The output of the torque conditioner 174 drives the shaft 168 and the gears 204, 205, which causes rotation of the belts 206, 207. Movement of the belts 206, 207 cause the rotation of drive gears 208, 209 which drives the arms 118 of rotatable member 104 to rotate or to provide tension on the printing form 22 based on the difference in torque provided by the torque conditioner 174 between the drum 56 and the rotational member 104.

Arm shaft 168 transfers rotation from motor 162 to rotatable member 104. Arm shaft 168 comprises two portions: first portion 212 and second portion 214. First portion 212 connects to arm clutch 166. First portion 212 also connects to torque conditioner 174. Second portion 214 connects to arms 118 of rotatable member 104 at the gears 204, 205 so as to evenly actuate the rotatable member 104.

Figure 8A:
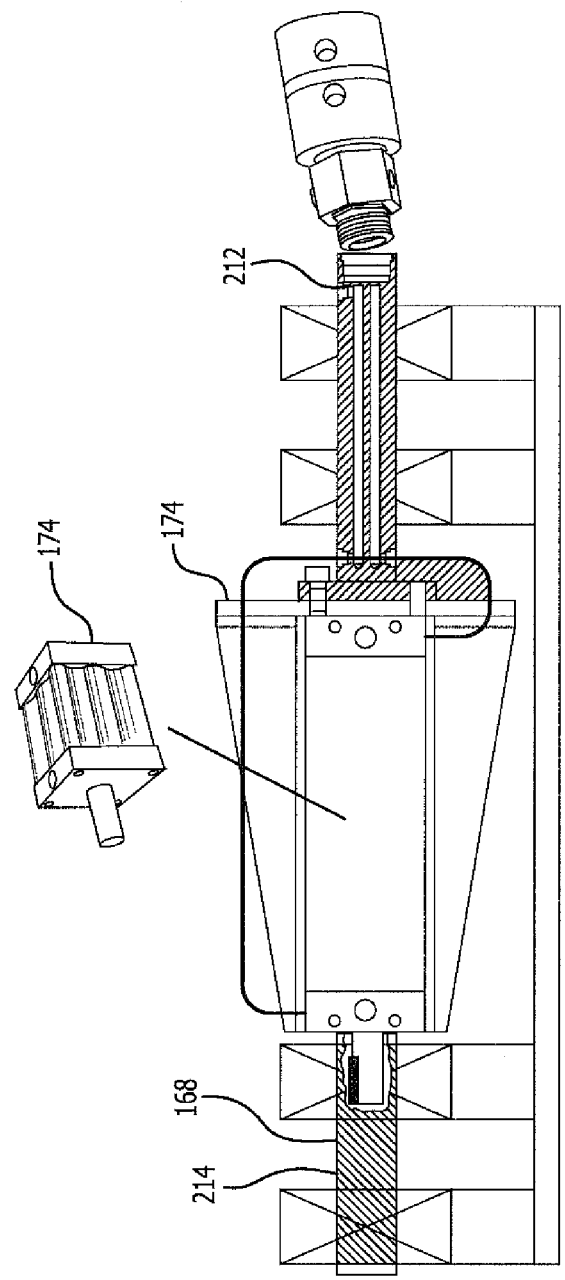
FIG. 8a is a cross-sectional view of a 90 degree rotary actuator shown in FIG. 8.

Torque conditioner 174 is capable of restricting the rotation of the second portion 214 of arm shaft 168. In the present embodiment, torque conditioner 174 is a rotary actuator device that pneumatically restricts the rotation of arm shaft 168 as shown in FIG. 8a. Torque conditioner 174 is used in relation to printing form tensioning subsystem 220. When actuated, torque conditioner 174 adjusts the relative rotational position of arm shaft 168. Motor 162 actuates the rotation of first portion 212 of arm shaft 168. Torque conditioner 174 then adjusts the relative rotational position of second portion 214 so that the ideal tension is created on printing form 22.

Actuation subsystem 160 further comprises the drum brake 216. Drum brake 216 may optionally be used during this step of the securing process to further limit the rotation of the drum 56. Drum brake 216 engages drum belt 184 and drum drive gear 186 to minimize the rotation of drum 56.

In the preferred embodiment, actuation subsystem 160 may further comprise a drag brake (not shown) to control unintended motion of rotatable member 104. Alternatively, rotatable member 104 may be counter-balanced.

Control system 175 controls the actuation subsystem 160. Control system 175 determines when motor 162 is powered on and turned off. Control system 175 further controls when clutches 166, 170 are in the engaged or disengaged positions. Control system 175 is also capable of controlling motor 162 and clutches 166, 170 based on the length of printing form 22. In the ideal embodiment, control system 175 further includes a sensor 217 near the stamper bar 106 on the centerline of the drum 56 as shown in FIG. 10. Sensor 217 may be used to determine the locations of the lead portion 24 and tail portion 26 of printing form 22 so that rotatable member 20 can be adjusted to the correct angular position relative to the head pin bar 102. Sensor 217 may also identify the locations of pins 112, 146 prior to engagement of the stamper bar 106. Alternatively, control system 175 may use manual input of the length of the printing form 22 to adjust motion of the actuation system.

Control system 175 may also be used to control torque conditioner 174 to create and maintain tension on printing form 22 by adjusting the air pressure within torque conditioner 174 in response to readings from other parts of the control system 175. For example, control system 175 may further include a tension sensor (not shown). Based on the tension sensed on the printing form 22, control system 175 can adjust the air pressure to a rotary actuator torque conditioner 174 to change the rotation of the torque conditioner to increase or decrease tension as needed.

Sensor 217 may also be used by control system 175 to control actuation of the stamper bar 106 and laydown rollers 108, 110. By sensing the locations of the head portion 24 and the tail portion 26 of printing form 22, sensor 217 can trigger the control system to effect the actuation of stamper bar 106 and laydown rollers 108, 110.

It will be appreciated that control system 175 may have more or less functionality than described. For example, the ideal embodiment currently comprises two laydown rollers. However, other embodiments may comprise one or more than two laydown rollers. The control system 175 may be adjusted based on the components of thermal processing system 20 so that all, some, or even none of the components are automated by control system 175.

Printing Form Tensioning Subsystem

Figure 10:
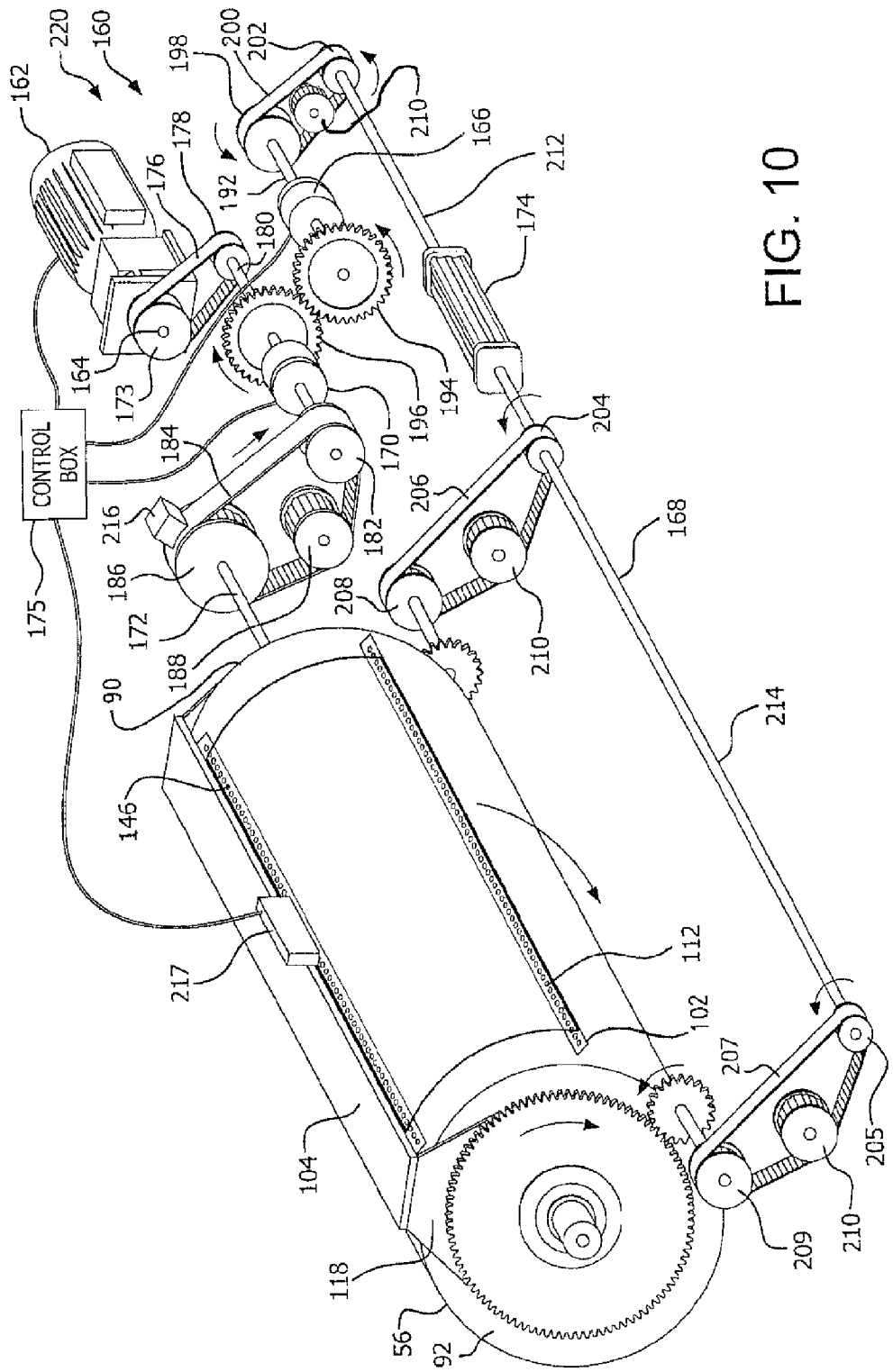
FIG. 10 is a perspective view of a the printing form actuation system shown in FIGS. 8 and 9.

FIG. 10 shows a printing form tensioning subsystem 220. The purpose of the printing form tensioning subsystem 220 is to maintain and adjust the tension on the printing form 22 during thermal development. If proper tension is not maintained, the printing form 22 may detach from the drum 56. If this occurs, the printing form may rub against other parts of thermal development system 20, causing damage, not only to the printing form 22, but also to other parts of the thermal development system 20 such as heating elements 80 and 52. Damage to the printing form 22 may distort the final printed image. Damage to the thermal development system 20, itself may result in considerable down-time for the equipment.

In the embodiment shown, the printing form tensioning subsystem 220 includes head pin bar 102, rotatable member 104, and actuation subsystem 160. A component of the tensioning subsystem is the torque conditioner. The torque conditioner or rotary torque means is preferably a rotary pneumatic actuator. Rotary pneumatic actuators are commercially available and for example testing has been performed using the Turn-Act Inc Model 142, Series TA (Part #113-1-S-2). This rotary pneumatic actuator provides 1,000 in-lb of torque and 90 degrees of rotation. The torque conditioner works by adjusting the air pressure in the torque conditioner to change the differences between the shaft rotation that is the input into the torque conditioner and that which is outputted from the torque conditioner. For example, if more torque is required, the output rotation of the torque conditioner for turning gear 204 and ultimately the arm drive gear will be greater than the rotation of the input shaft of the torque conditioner. By varying the output rotation of the torque conditioner, the torque exerted on the rotational member which is secured to the printing form tail portion is different than the torque exerted on the printing form lead portion by the drum. By exerting a different torque on the tail portion than is exerted on the lead portion, a tension is created in the printing plate. Tension of about 5 to 15 pounds per linear inch of the printing form 22, preferably 8 pounds per linear inch, is applied to keep the printing form 22 affixed to drum 56 when printing form 22 has a size range of 24 inches by 30 inches to 52 inches by 80 inches and a thickness range of 0.045 inches to 0.250 inches.

The tension can be adjusted to the particular application by adjusting the air pressure in the torque conditioner. Further, the system can adjust the air pressure automatically during operation to maintain the desired tension by measuring the tension on the plate, and have a feedback controller that controls the air pressure to maintain the desired tension. In one embodiment, control system 175 may adjust the air pressure in the torque conditioner 174 before, during, and after thermal processing. In this way, prior to thermal processing, torque conditioner 174 may have an initial air pressure that provides for the ideal amount of tension in the printing form 22. During thermal processing, the printing form 22 may expand as heat is applied. For this reason, the rotatable member will move or adjust its position in relation to the circumferential distance from the head pins 112 and will maintain desired tension at the same pressure. Control system 175 will adjust the air pressure within torque conditioner 174 to increase or decrease the tension on the printing form. It will be appreciated that control system 175 can adjust the air pressure on an as-needed basis during processing. For example, the air pressure might not be adjusted at all during processing or it may be adjusted several times as the drum 56 continues to rotate. As more fully described below, tension in the printing form 22 should be reduced prior to removal from drum 56. After processing is complete, control system 175 will adjust the air pressure within the torque conditioner 174 to remove the tension on the printing form 22 created by the torque conditioner. Most preferably, the control system 175 and the torque conditioner 174 function to maintain a constant tension on the printing form by adjusting the air pressure in the torque conditioner as needed.

Alternatively to a pneumatic actuator, the torque conditioner can be a mechanical device such as that described in a second embodiment which employs the use of a disc brake 250. Additionally, a hydraulic or magnetic device may be used instead to create and maintain the desired tension. The important characteristic of the torque conditioner is that it varies the out put torque so that a differential torque is created on the printing form.

As described in relation to the printing form securing system 100, head pin bar 102 functions to secure the lead portion 24 of printing form 22. In the context of the printing form tensioning subsystem 220, head pin bar 102 maintains the lead portion 24 at a set angular position relative to tail portion 26 so that the proper tension may be maintained on the printing form 22 during thermal processing. Head pin bar 102 functions to secure the lead portion 24 with pins 112. Pins 112 retain the lead portion 24 of the printing form 22.

Printing form tensioning subsystem 220 further comprises rotatable member 104. Rotatable member 104 is further described above in relation to the printing form securing system 100. Rotatable member 104 comprises tail pin bar 134 and arms 118. In the context of the printing form tensioning subsystem 220, tail pin bar 134 and arms 118 function to maintain the tail portion 26 of printing form 22 at a fixed angular position relative to the lead portion 24. Rotatable member 104 can be disengaged from the drum 56, so that it rotates about the drum 56 independently from the rotation of the drum 56 along rotatable member axis 152, which is congruent to drum axis 154.

Printing form tensioning subsystem 220 further comprises actuation subsystem 160. In addition to actuating components of the thermal processing system 20 during the process of securing the printing form 22 to the drum 56 as more fully described above, actuation subsystem 160 also functions to supply tension to the printing form during processing of the printing form 22.

Printing Form Removal Subsystem

Figure 11:
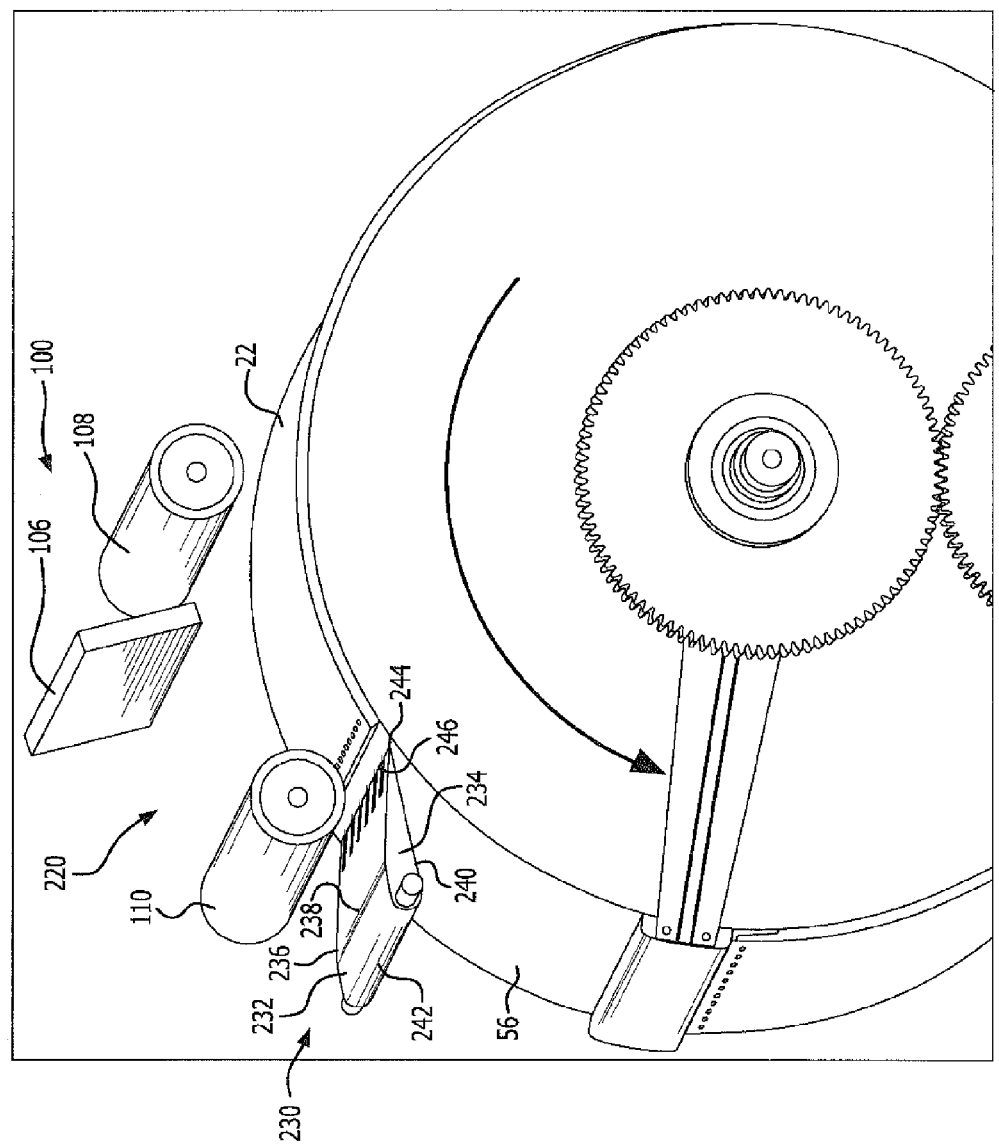
FIG. 11 is a perspective view of one embodiment of a printing form securing and tensioning system and a printing form removal system with portions broken away.
Figure 12:
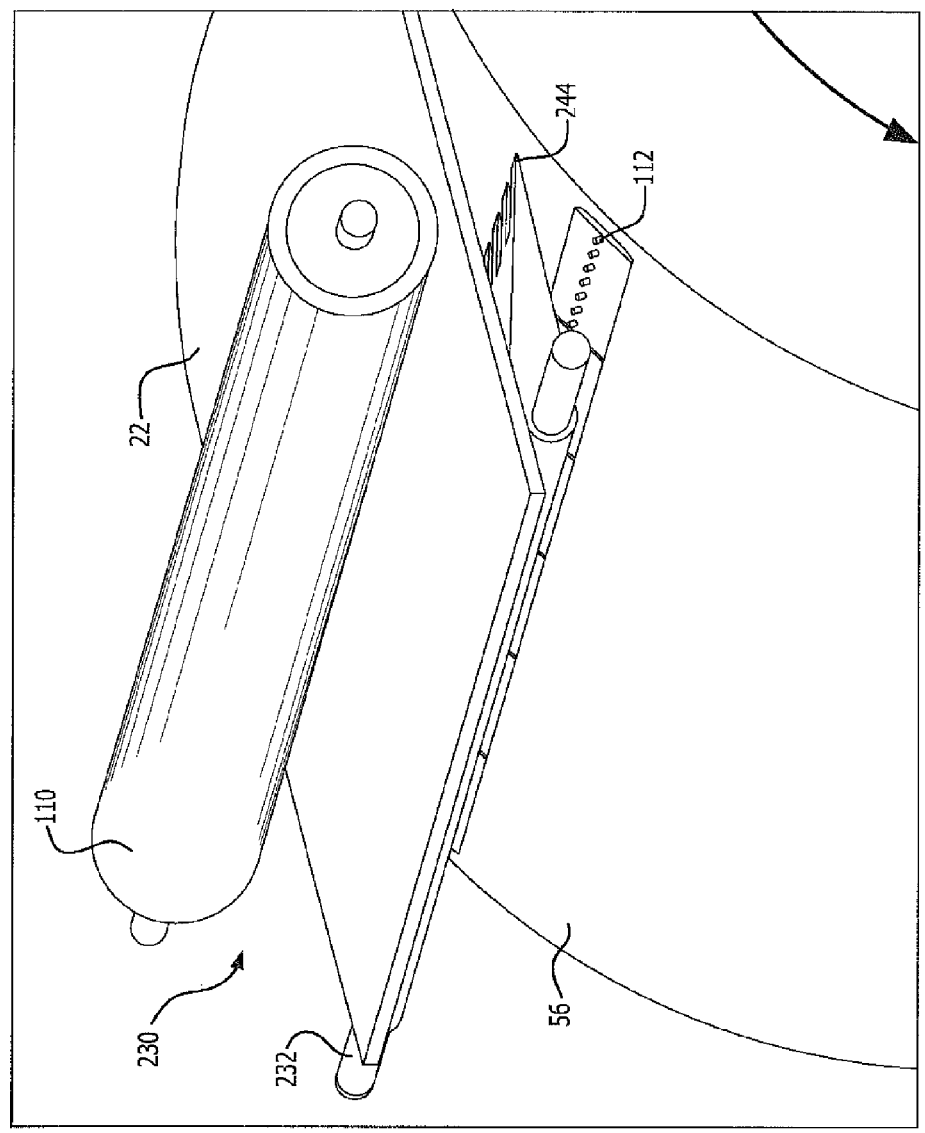
FIG. 12 is a perspective view of the printing form securing and tensioning system and a printing form removal system shown in FIG. 11 with portions broken away.
Figure 13:
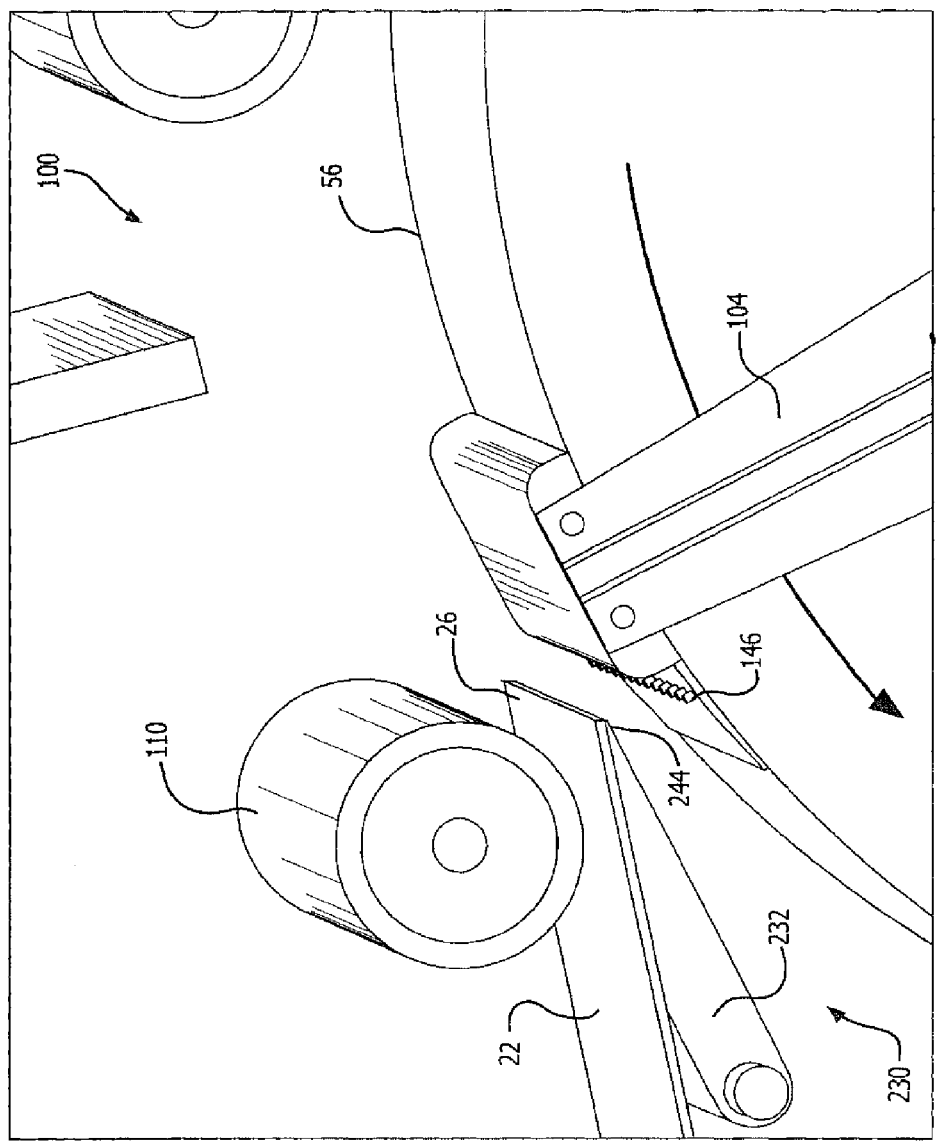
FIG. 13 is a perspective view of a printing form securing and tensioning system and a printing form removal system shown in FIGS. 11 and 12 with portions broken away.

Once the development process is completed, printing form 22 must be removed from the drum. FIGS. 11-13 show printing form removal subsystem 230 and the process of removing the printing form from drum 56.

Printing form removal subsystem 230 comprises stripper plate 232, laydown roll 110 and adjustable arms (not shown). Printing form removal subsystem 230 functions to remove printing form 22 from the drum 56 of the thermal development system 20. Stripper plate 232 functions to engage printing form 22 and pins 112, 146 by wedging in between the printing form 22 and the drum 56, with tooth-like cutouts 246 of the stripper plate 232 aligned with the pins 112, 146 so as to detach the printing form 22 from the pins. Stripper plate 232 has a generally triangular cross section and, generally, has five sides: front 234, back 236, top 238, bottom 240, and end 242. Top 238 and bottom 240 connect to each other at blade edge 244. Blade edge 244 contains cutouts 246 that correspond to the locations, size, and shape of pins 112, 146. As noted above in relation to head pin bar 102, head pin bar 102 may comprise cutouts 246 that correspond to the tooth-like projections on blade edge 244. These cutouts may be scallop-shaped to make it easier for blade edge 244 to engage the printing form 22 and wedge between printing form 22 and pins 112, 146.

Laydown roll 110 functions to engage the drum 56 and printing form 22 so as to maintain tension on the printing form 22 during the removal process. By maintaining tension on the printing form during the removal process, laydown roll 110 prevents the printing form 22 from falling off of the drum 56.

Adjustable arms (not shown) are used to actuate stripper plate 232 so that it is capable of moving from a disengaged position away from the drum 56 to an engaged position wherein the stripper plate 232 touches the printing form 22. The adjustable arms may further include a multiple-position pneumatic cylinder or a linear actuator that provides for the actuation of the stripper plate 232.

Figure 2:
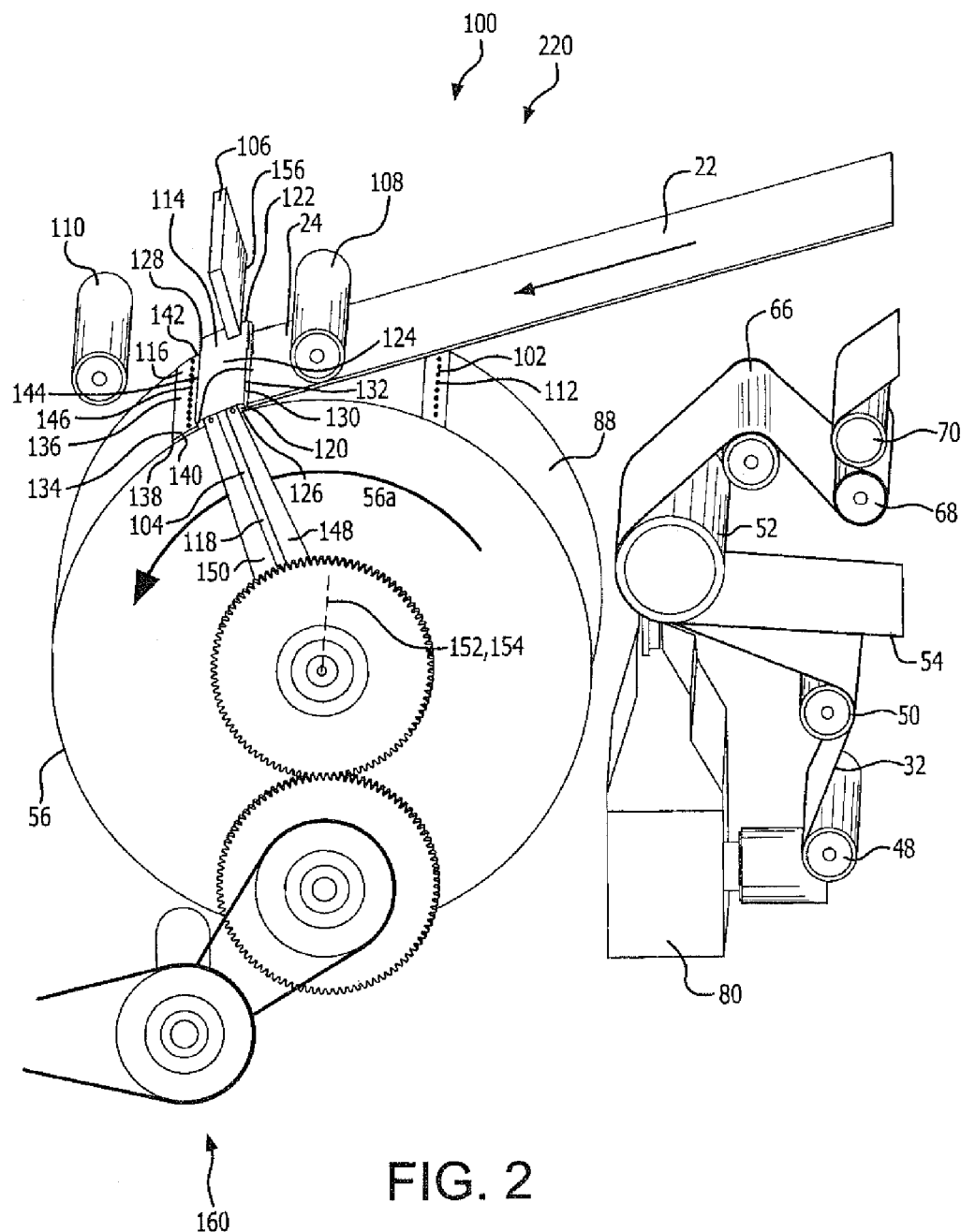
FIG. 2 is a perspective view of one embodiment of a printing form securing and tensioning system.
Figure 2A:
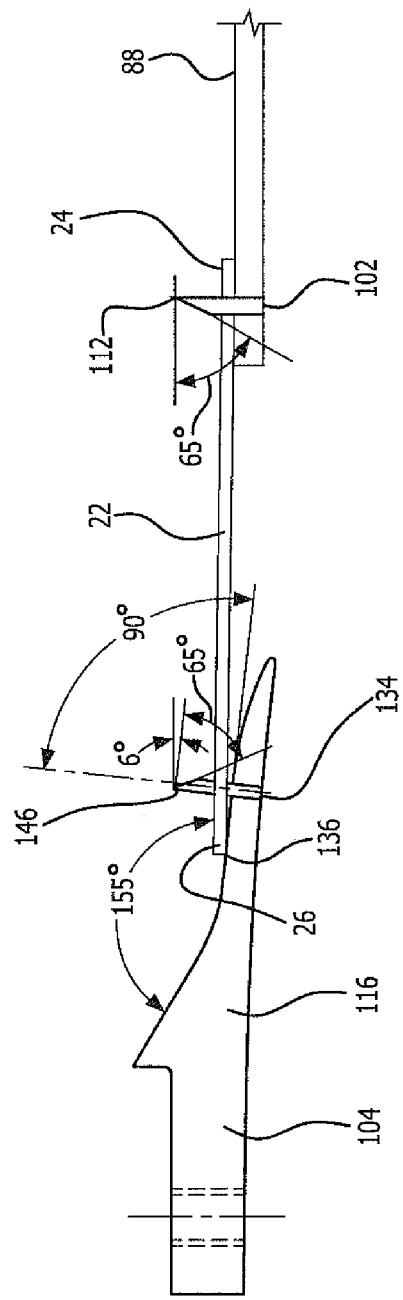
FIG. 2a is a front view of the printing form securing and tensioning system shown in FIG. 2 with portions broken away.

Stripper plate 232 is also capable of rotational actuation in which the stripper blade 232 rotates about its end 242. In this way, blade edge 244 of stripper plate 232 can engage printing form 22 and pins 112, 146 in such a way that printing form 22 may be separated from pins 112, 146 and then rotate away from the drum 56. In one embodiment, the stripper plate 232 rotates or rises from the drum surface 88 only enough to clear the body of the rotatable member 104. In other embodiments, the stripper plate 232 rotates or rises from the drum surface 88 for the bottom 240 of stripper blade 232 and clears the pins 112 as the drum 56 rotates. This process is described below.
Operation of Securing Subsystem The operation of the securing subsystem is best understood with reference to FIGS. 2-9. FIG. 2 shows printing form securing subsystem 100 prior to attachment of printing form 22 to drum 56. Lead portion 24 of printing form 22 is aligned with rotatable member 104 and drum 56. At this point in the process, drum clutch 170 has engaged motor shaft 164, so as to transfer rotation from motor 162 to drum shaft 172. Further, arm clutch 166 has engaged motor shaft 164 so as to transfer rotation from motor 162 to arm shaft 168. During the plate securing process, torque conditioner 174 is moved to the non-torquing position so as not to cause any further rotation of arm shaft 168. As shown in FIG. 2, lead portion 24 is also aligned under stamper bar 106. FIG. 2 shows head pin bar 102 unaligned with lead portion 24 and stamper bar 106. Further, laydown roll 108 and laydown roll 110 are in retracted positions. Pressure roller 52 and heater 80 are also retracted from the drum 56.

Figure 3:
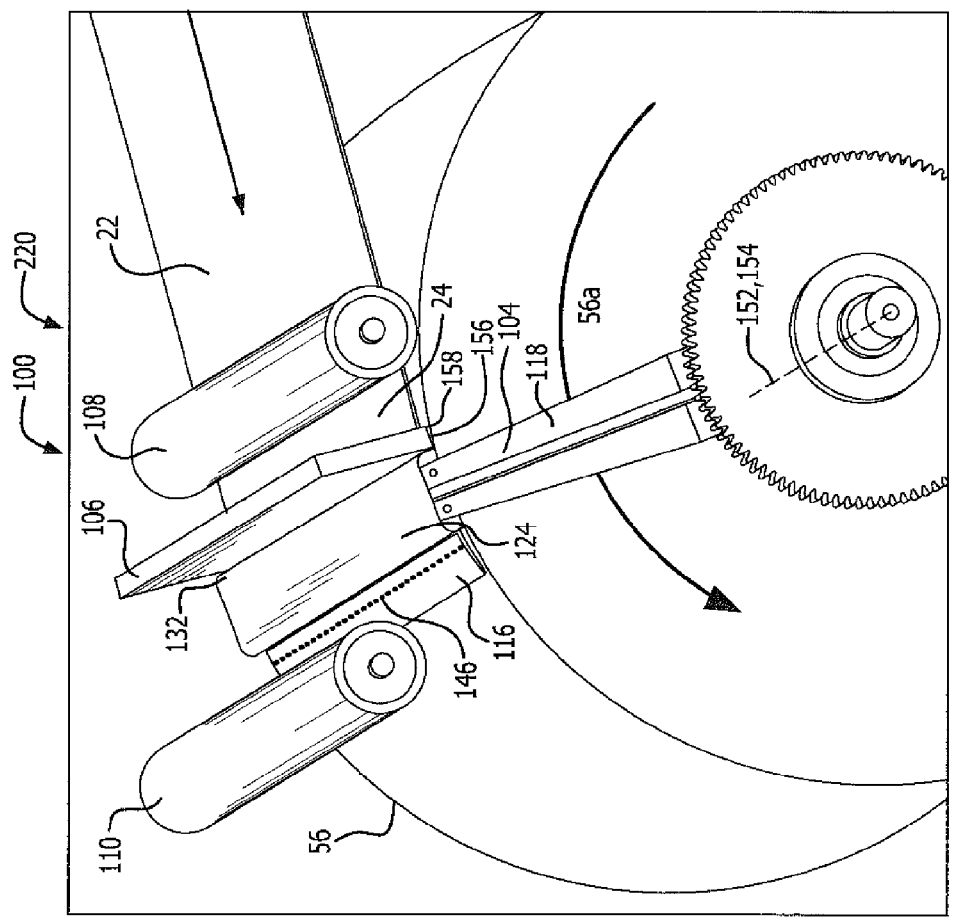
FIG. 3 is a perspective view of the printing form securing and tensioning system illustrated in FIG. 2, with portions broken away.

FIG. 3 shows how printing form securing subsystem 100 grips the lead portion 24 of printing form 22. In FIG. 3, lead portion 24 is flush with flat edge 132 of the body 114 of the rotatable member 104 at the home position. Laydown roll 108 has engaged the printing form 22 to place pressure on it and hold it in place in place relative to drum 56. The sensor 217 (see FIG. 1) senses the position of the lead portion 24 and causes the stamper bar 106 to cycle from the nonstamping position to the stamping position in which stamper bar 106 engages the printing form 22 to push the first set of pins 112 through the printing form and back to the nonstamping position. FIG. 3 shows that stamper bar 106 has a plate engaging portion 156 which contacts printing form 22. At this point, the first portion, which in this embodiment is the lead portion, of the printing form has been secured to the drum by the pins 112 penetrating through the printing form 22.

Figure 4:
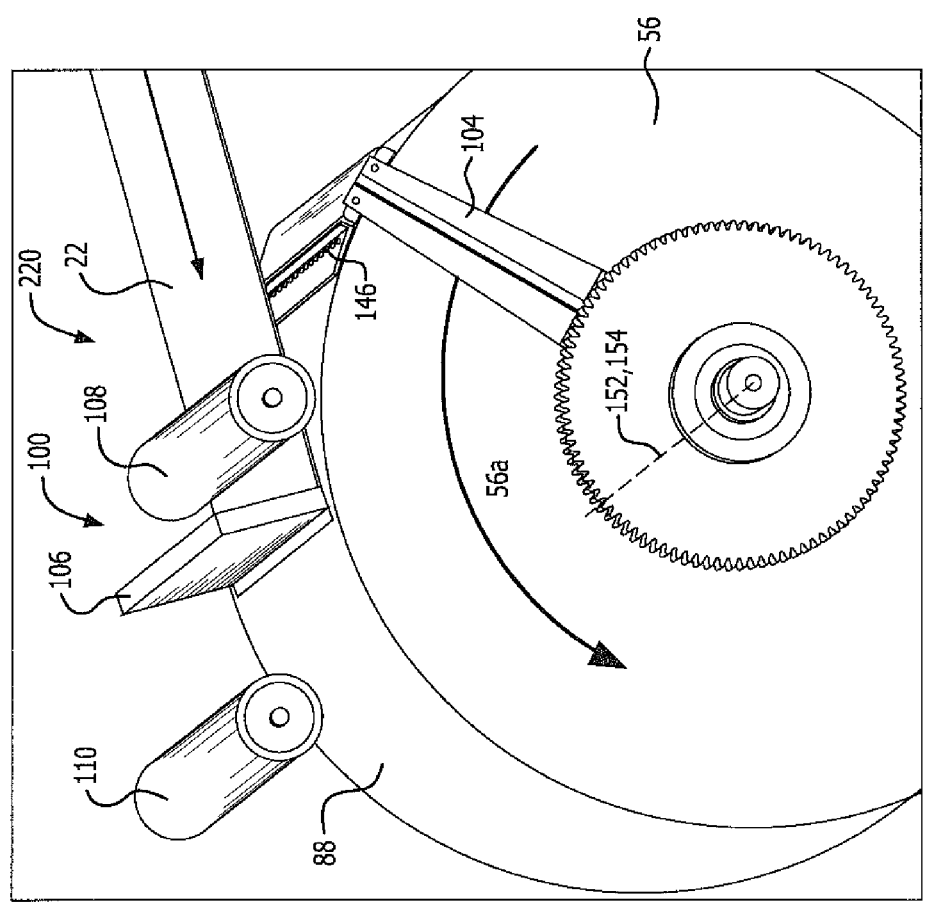
FIG. 4 is a perspective view of the printing form securing and tensioning system illustrated in FIGS. 2 and 3, with portions broken away.

FIG. 4 shows the second step of the securing process which includes moving the second set of pins relative to the drum and the first set of pins. With stamper bar 106 and laydown roll 108 engaged on printing form 22, rotatable member 104 is rotated about drum 56 by motor 162. In order to accomplish this, the arm clutch 166 is moved to the engaged position, and the motor output is transferred by the actuator subsystem 160 as described above with references to FIGS. 8 and 9. In one embodiment, rotatable member 104 is rotated a circumferential distance that is about equal to the length of the printing form 22. Alternatively, the rotatable member 104 is rotated a distance that is equal to the distance that is desired between the first and the second sent of pins 112, 146 penetrating the printing form 22. Because the rotatable member 104 can be positioned to the length of the printing form 22, the system can be used with a printing form of any desired length that is less than the circumference of the drum 56. This step is accomplished by disengaging the drive clutch 170 and engaging the arm clutch 166 so that the motor 162 rotates the rotational member 104 but not the drum 56. Additionally, the drum brake 216 may optionally be used during this step of the securing process to further limit the rotation of the drum 56. Drum brake 216 engages drum belt 184 and drum drive gear 186 to minimize the rotation of drum 56. Then the motor 162 is powered and the motor output is transferred from the motor 162 through the engaged arm clutch 166 to the arm drive gear 202 and the rotational member 104 as described above.

Figure 5:
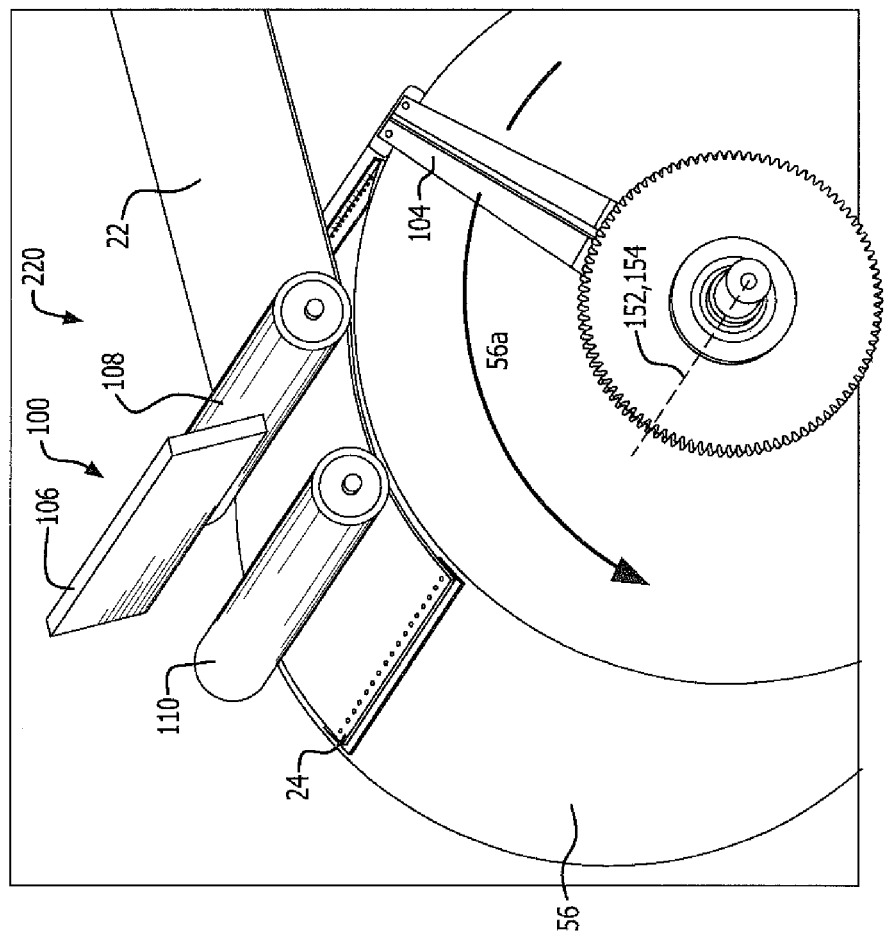
FIG. 5 is a perspective view of the printing form securing and tensioning system illustrated in FIGS. 2, 3, and 4, with portions broken away.

FIG. 5 shows the third step of the process. After the rotatable member 104 has rotated about drum 56, laydown roll 108 and stamper bar 106 disengage from the printing form 22 prior to the rotation of drum 56 about drum axis 154. After the head pin bar 102 rotates past the laydown roll 110, the laydown roll 110 lowers to engage the printing form 22. In this way, laydown roll 110 holds printing form 22 in place on drum 56 and creates tension on the printing form 22 before the tail portion 26 of printing form 22 is secured. The arm clutch 166 is disengaged, and the drive clutch 170 is engaged. With drum clutch 170 engaged, motor 162 of actuation subsystem 160 actuates the rotation of drum 56 in a counterclockwise direction (shown by arrow 56a) carrying with it printing form 22 until tail portion 26 of printing form 22 is approaching the home (stamping) position. At this point, the drum 56 carrying the printing form is rotated relative to the rotatable member 104 and the second set of pins 146 which are stationary.

Figure 6:
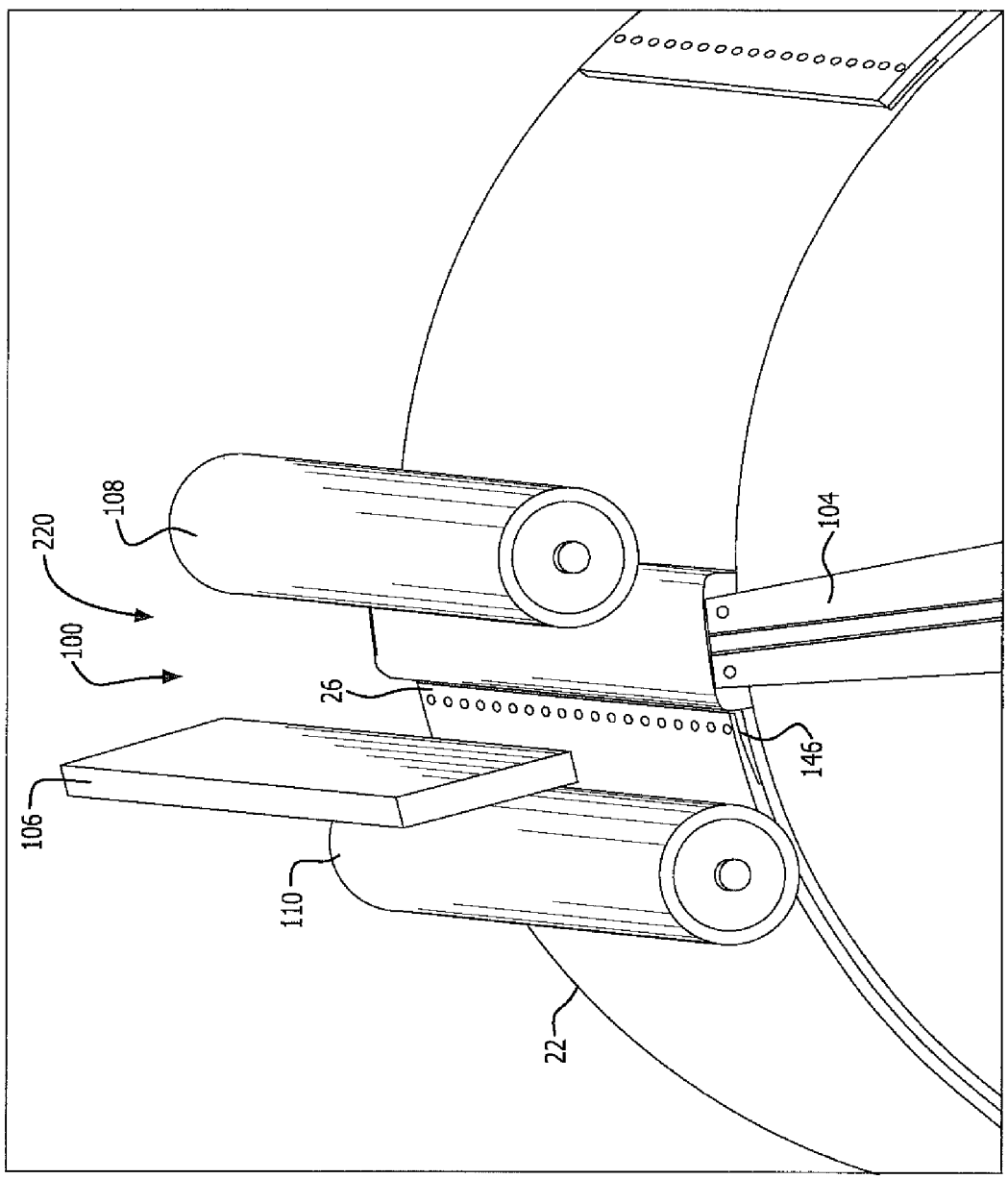
FIG. 6 is a perspective view of the printing form securing and tensioning system illustrated in FIGS. 2, 3, 4, and 5, with portions broken away.

FIG. 6 shows the next step of the process by which the printing form securing system 100 grips printing form 22. With laydown roll 110 engaged on the printing form 22, rotatable member 104 is rotated so that tail pin bar 134 is aligned with the stamper bar 106 and the tail portion 26 of printing form 22 in the home position. This is accomplished by engaging the arm clutch 166 and disengaging the drum clutch 170 so that the motor 162 drives the rotational member 104 and the tail pins 146 until they are under the stamper bar 106. Following the movement of the rotational member 104 to align the tail pins 146 with the stamper bar 106, the arm clutch 166 is disengaged and the drum clutch 170 is engaged. The motor 162 then drives the drum clutch 170 and the drum 56 to rotate and to pull the printing form 22 so that the tail portion 26 is under the stamper bar 106 and above the tail pins 146. Once aligned, stamper bar 106 engages the printing form 22, pressing printing form 22 on to pins 146. The engagement of stamper bar 106 with printing form 22 causes pins 146 to puncture tail portion 26 of printing form 22, thereby securing the tail portion 26 of the printing form on the pins 146. The sensor 217 can be used to sense the position of the tail pins 146 under the stamper bar 106, and a controller 175 can receive the position signal from the sensor and trigger the stamper bar 106 to cycle.

Figure 7:
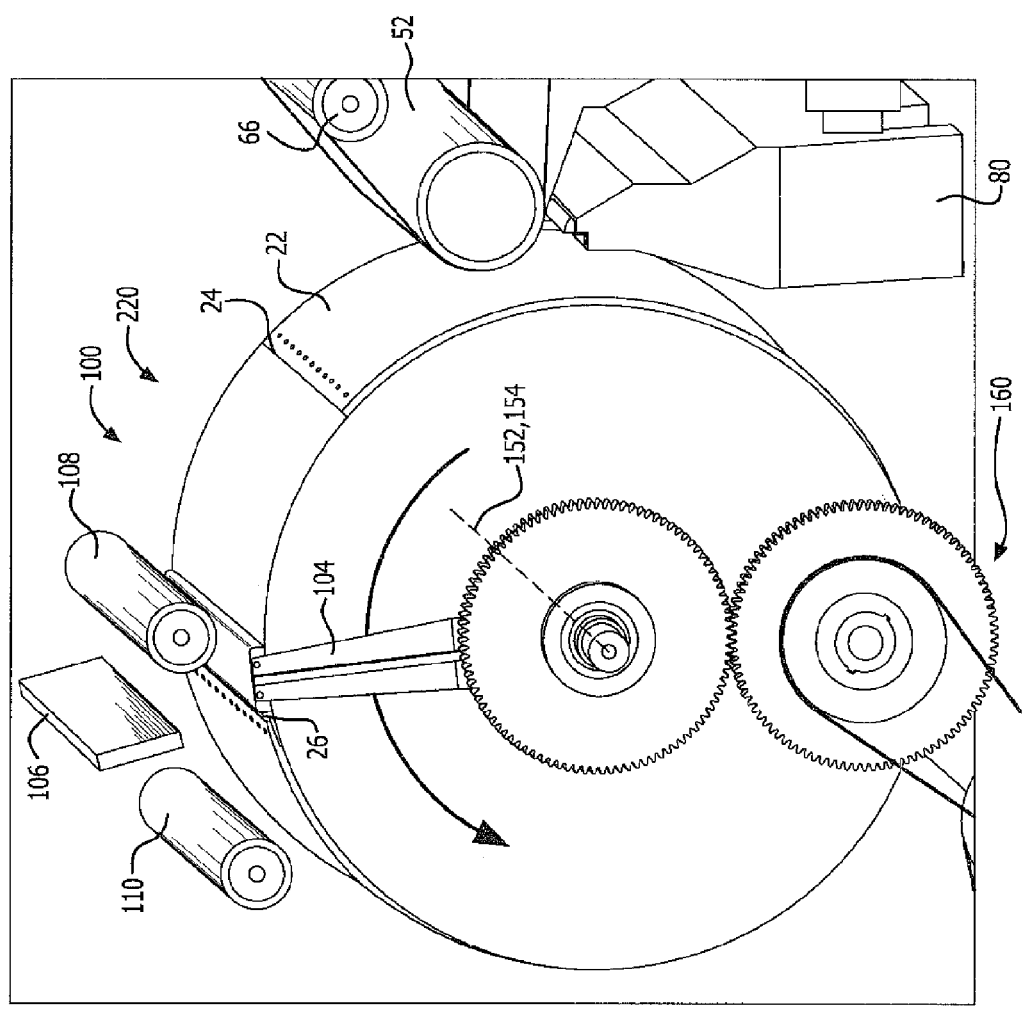
FIG. 7 is a perspective view of the printing form securing and tensioning system illustrated in FIGS. 2, 3, 4, 5, and 6, with portions broken away.

As shown in FIG. 7, once tail portion 26 of printing form 22 is secured on tail pins 146, the stamper 106 and laydown roll 110 disengage from printing form 22. Once stamper 106 and laydown roll 110 disengage, drum 56 begins rotation and the development process described above can begin.

During the development process, actuation subsystem 160 and control system 175 functions to create and maintain tension on the printing form 22. In the embodiment shown in FIGS. 8 through 10, motor 162 actuates drum 56 and rotatable member 104. In the present embodiment, motor 162 works in conjunction with arm clutch 166, drum clutch 170, and torque conditioner 174 to maintain and adjust tension on printing form 22. The initial air pressure within the torque conditioner 174 will maintain the desired tension in the plate. Because printing form 22 may expand (or change dimension/s) during thermal processing as heat is applied, the control system 175 will adjust the air pressure within torque conditioner 174 to increase (or decrease) the tension on the printing form as required during processing. The air pressure might not be adjusted at all during processing or it may be adjusted several times as the drum 56 continues to rotate. The torque conditioner and the control system preferably operate to maintain a substantially uniform tension on the printing form by adjusting the air pressure as needed.

During thermal processing, clutches 166, 170 are both engaged and motor 162 is used to actuate both the drum 56 and rotatable member 104. Gear drive 180 rotates in the clockwise direction. When drum clutch 170 is engaged, rotation of gear drive 180 actuates clockwise rotation of drum 56 by belt drive 184. When clutch 166 is also engaged, gear drive 192 also actuates rotation of rotatable member 104 by belt drive 200. The rotation of rotatable member 104 is controlled by torque conditioner 174. In this embodiment, the torque conditioner 174 is controlled by air pressure. By varying the air pressure in the torque conditioner, the output of the torque conditioner is adjusted relative to the torque asserted on the drum, so that the torque asserted on the rotational member differs from the torque asserted on the drum. This creates the torque differential between the drum which is secured to the lead portion of the printing form and the rotational member which is secured to the tail portion of the printing form. This torque differential results in a tension on the printing form. The air pressure in the torque conditioner can be automatically adjusted during operation to maintain a desired tension on the printing form. The desired tension will depend on the printing form material, geometry, and dimensions.

After thermal processing, printing form 22 must be removed from thermal process system 20. FIG. 11 shows the first step of the printing form removal process. At this point, the lead pins 112 rotate past the stamper bar 106 and the roller 110. Once pins 112 rotate past laydown roll 110, laydown roll 110 lowers so as to engage the printing form 22 and drum 56. At this point, the laydown roll 110 is functioning so as to create tension on the printing form 22, thereby keeping the printing form 22 affixed to the drum 56 during the removal process. As shown in FIG. 11, stripper blade 232 engages the printing form by laterally lowering and rotating clockwise so that blade edge 244 is flush with lead portion 24 of printing form 22 and drum 56. At this time the tension in the print form 22 is removed by removing the air pressure in the torque conditioner. The tension must be removed at this step so that the stripper blade 232 only needs to lift the printing form 22 off of the pins 112 without working against tension on the printing form 22. Clutches 166, 170 are in the engaged position so as to transfer actuation of motor 162 to drum 56 and rotatable member 104 then rotate in a counterclockwise direction during the entire plate removal process. As shown in FIG. 12, the rotation of the drum 56 pushes printing form 22 on to the top 238 of stripper blade 232, wedging the stripper blade between pins 112 and the printing form 22. Cutouts 246 engage pins 112 and printing form 22 subsequently separates from pins 112.

Once the lead portion 24 of printing form 22 is separated, in one embodiment the stripper blade 232 rotates blade edge 244 away from drum 56 in the counterclockwise direction, or the stripper blade 232 is raised, so that cutouts 246 are above pins 112 and drum 56 can rotate freely without the pins 112 catching on the stripper blade 232. The drum 56 then rotates to move the pins 112 past the stripper blade 232, the stripper blade 232 may or may not return to its initial position, and the drum continues to rotate as shown in FIG. 12. In another embodiment, the blade edge 244 of the stripper blade 232 is shaped and positioned so the cutouts 246 align with the pins 112 and slides on the surface of the rotating drum 56. As the drum 56 rotates, the circumference of the drum 56 rotates the pins 112 through openings between the tooth-like projections on the blade edge 244 and clears the pins 112 of the stripper blade 232 that is sliding on the surface of the drum 56 so that the pins 112 are not caught by the stripper blade 232 as the drum 56 continues to rotate as shown in FIG. 12.

FIG. 13 shows the final step of the process of removing the printing form 22 from drum 56. Prior to the drum 56 and rotatable member 104 rotating so that the stripper blade 232 is in contact with the tail portion 26 of printing form 22, blade edge 244 of the stripper plate 232 may be rotated in the clockwise direction so as to engage tail end pins 146. The stripper edge 244 may slide on the surface of the drum 56, as the drum 56 continues to rotate so that cutouts 246 engage pins 146. The stripper blade 232 separates printing form 22 from pins 146 by wedging between the printing form 22 and the drum 56, and the tooth-like projections between the pins 146. The stripper blade 232 then rotates in the counterclockwise direction away from the drum 56, thereby completely separating printing form 22 from drum 56, and clearing the body 114.

Figure 14:
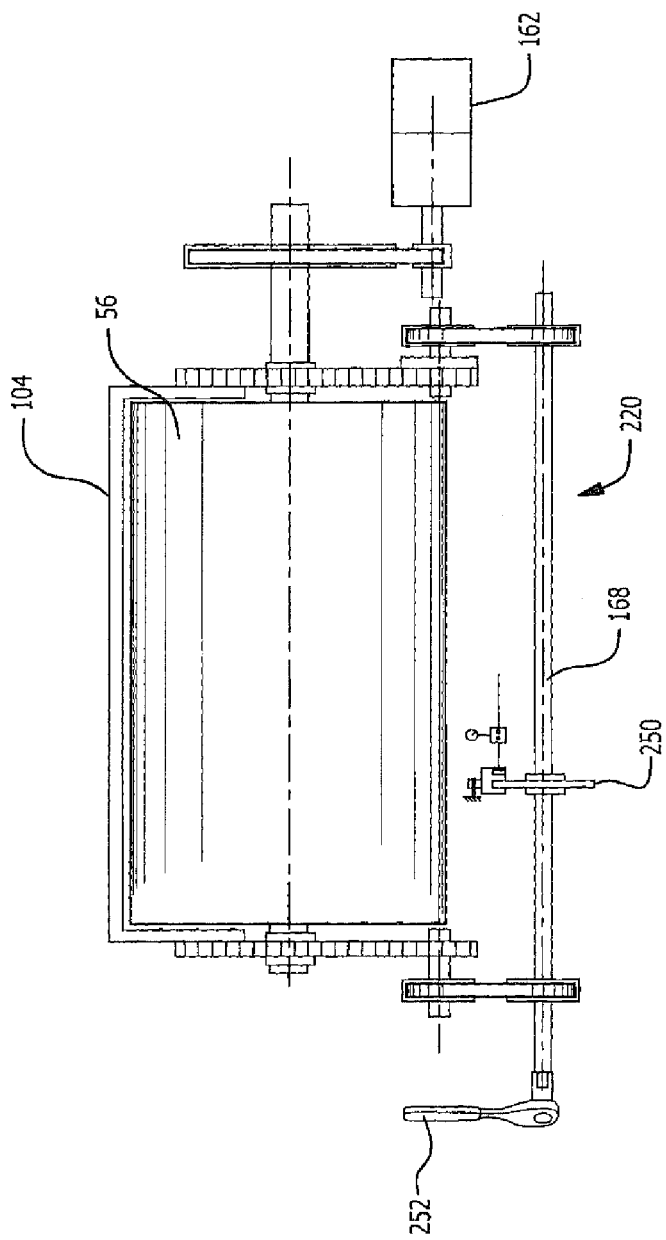
FIG. 14 is a front view of an alternative embodiment of a printing form securing and tensioning system.

The apparatuses and methods described above represent the preferred embodiments of the securing and tensioning systems. As an alternative to the single drive system described above in which motor 162 drives the rotational motion of both the drum 56 and the rotatable member 104, the motor may instead only drive the rotation of the drum 56. In this alternative embodiment, shown in FIG. 14, printing form tensioning subsystem 220 may control the tension on printing form 22 through the use of a disc brake 250 that applies force to rotatable member 104 by restricting the rotation of arm shaft 168. This alternate embodiment does not have clutches 166, 170. As described fully above, head pin bar 102 on drum 56 fixes the lead portion 24 of printing form 22. Tail pin bar 134 fixes the tail portion 26.

In this embodiment, motor 162 functions only to actuate drum 56 through the engagement of drum shaft 172 with motor shaft 164 through a series of gears. The rotation of drum 56 itself functions to rotate rotatable member 104 during the development process. Because rotatable member 104 is attached to drum 56 by way of printing form 22, rotatable member 104 is pulled about drum 56.

Disc brake 250 restricts the rotation of rotatable member 104 applying a force to the arm shaft 168 that is opposite the rotational movement of the drum, thereby creating tension of printing form 22. By applying this force, the brake functions in a similar way as the torque conditioner 174 described in relation to the preferred embodiment to fix the relative angular position of the tail portion 26 in relation to the lead portion 24.

During the thermal development process, this alternative embodiment relies on the rotation of the drum 56 to subsequently rotate rotatable member 104. However, during the attachment and removal processes, additional actuation of rotatable member 104 is needed. Preferably, this actuation is provided manually by an operator (not shown) rotating hand crank 252. Those of skill in the art will understand that this second means of actuation may be provided by other types of actuation devices, including, but not limited to an electric motor, a pneumatic actuator, or a hydraulic actuator.

This second means of actuation is provided during the attachment process to rotate rotatable member 104 about the drum 56 once the printing form 22 has been attached to head pin bar 102. Using the preferred method of this second embodiment, the operator rotates the hand crank 252 which moves the rotatable member 104 about the drum until the tail pins 146 are under stamper bar 106. The motor 162 then rotates the drum 56, and, subsequently, the lead portion 24 of printing form 22 (attached to pins 112) until the tail portion 26 of the printing form 22 is under stamper bar 106 and above pins 146. The remainder of the attachment process then proceeds as described above.

In this embodiment, a second means of actuation is also required during the removal process. Using the preferred method of this embodiment, the operator rotates the hand crank 252 after the stripper plate 232 has detached the lead portion 24 of the printing form 22 from the pins 112. This rotation advances the rotatable member 104 to mimic the two-drive system described above.

It should be appreciated that several example embodiments of a printing form securing and tensioning system have been described and that the described examples have been provided for the purpose of explanation and is not to be construed as limiting the invention Although the printing form securing and tensioning system has been described with reference to preferred embodiments or preferred methods, it is understood that the words which have been used herein are words of description and illustration, rather than words of limitation. Furthermore, although the printing form securing and tensioning system has been described herein with reference to particular structure, methods, and embodiments, the embodiments are not intended to be limited to the particulars disclosed herein, as the invention extends to all structures, methods and uses that are within the scope of the present invention. Those skilled in the relevant art, having the benefit of the teachings of this specification, may effect numerous modifications to the invention as described herein, and changes may be made without departing from the scope and spirit of the invention.

What is claimed is:

1. A method of tensioning a printing form that is disposed circumferentially about a rotatable drum, comprising:
   coupling a first portion of the printing form to the drum;
   tensioning the printing form by coupling a second portion of the printing form to a rotatable member that is disposed circumferentially about the drum, and can rotate independently about the drum surface for securing printing forms of different sizes circumferentially about the drum; and
   adjusting the tension on the printing form so as to maintain substantially constant tension on the printing form by using a rotary torque means to adjust the torque on the member.

2. The method of claim 1 wherein the step of coupling comprises stamping the first portion of the printing form onto a first set of pins that are coupled to the drum.

3. The method of claim 1 wherein the step of tensioning comprises stamping the second portion of the printing form onto a second set of pins that are coupled to the member.

4. The method of claim 1 wherein the rotary torque means comprises a pneumatic actuator and the step of adjusting the tension comprises adjusting the air pressure of the pneumatic actuator to adjust the torque on the member.

5. The method of claim 1 where in the rotary torque means comprises a braking mechanism.

6. The method of claim 1 further comprising tensioning the printing form by rotating the drum and thereby applying a first torque on the printing form and applying a second torque on the printing form with the rotary torque means wherein the first torque and the second torque differ.

7. The method of claim 1 further comprising using a motor to tension the printing form by rotating the drum with the motor and thereby applying a first torque on the printing form and applying a second torque on the member and the printing form by adjusting the second torque with the rotary torque means.

8. The method of claim 1 further comprising adjusting the tension on the printing form so as to maintain substantial) constant tension on the printing form as the drum is rotating.

* * * * *

UNITED STATES PATENT AND TRADEMARK OFFICE
CERTIFICATE OF CORRECTION

PATENT NO. : 8,635,953 B2  Page 1 of 1
APPLICATION NO. : 13/765886
DATED : January 28, 2014
INVENTOR(S) : Theodore William Frentzel, Jr. and Carl Bernard Arnold It is certified that error appears in the above-identified patent and that said Letters Patent is hereby corrected as shown below:

In the Claims

Column 24, Claim 8, Line 44, please change "substantial)" to read -- substantially --.

Signed and Sealed this
Seventh Day of April, 2015

Michelle K. Lee
*Director of the United States Patent and Trademark Office*